(12) United States Patent
Dehe et al.

(10) Patent No.: US 9,711,392 B2
(45) Date of Patent: Jul. 18, 2017

(54) FIELD EMISSION DEVICES AND METHODS OF MAKING THEREOF

(75) Inventors: Alfons Dehe, Reutlingen (DE); Damian Sojka, Regensburg (DE); Andre Schmenn, Sachsenkam (DE); Carsten Ahrens, Pettendorf (DE)

(73) Assignee: Infineon Technologies AG, Neubiberg (DE)

( * ) Notice: Subject to any disclaimer, the term of this patent is extended or adjusted under 35 U.S.C. 154(b) by 714 days.

(21) Appl. No.: 13/558,265

(22) Filed: Jul. 25, 2012

(65) Prior Publication Data

US 2014/0028192 A1    Jan. 30, 2014

(51) Int. Cl.
*H01L 21/762* (2006.01)
*H01L 23/60* (2006.01)
*H01L 21/764* (2006.01)
*H01L 27/02* (2006.01)
(Continued)

(52) U.S. Cl.
CPC ...... *H01L 21/76289* (2013.01); *H01L 21/764* (2013.01); *H01L 23/60* (2013.01); *H01L 24/32* (2013.01); *H01L 24/48* (2013.01); *H01L 24/73* (2013.01); *H01L 27/0288* (2013.01); *H01L 2224/32245* (2013.01); *H01L 2224/48091* (2013.01); *H01L 2224/48247* (2013.01); *H01L 2224/73265* (2013.01); *H01L 2924/00014* (2013.01); *H01L 2924/13091* (2013.01); *H01L 2924/181* (2013.01); *H02H 9/046* (2013.01)

(58) Field of Classification Search
CPC ....... H01L 2924/00014; H01L 2924/00; H01L 2924/13091; H01L 2224/32245; H01L 2224/48091; H01L 2224/48247; H01L 2224/73265; H01L 2224/45099; H01L 21/76289; H01L 21/764; H01L 23/28; H01L 23/488; H01L 23/60; H01L 24/32; H01L 24/48; H01L 24/73; H01L 24/0288
See application file for complete search history.

(56) References Cited

U.S. PATENT DOCUMENTS 3,755,704 A      8/1973  Spindt et al.
3,858,125 A  *  12/1974  Nelson ...................... H01P 1/14
                                                                  313/104
(Continued)

FOREIGN PATENT DOCUMENTS

CN       1529197 A       9/2004
JP    2006004966 A       1/2006

OTHER PUBLICATIONS

"Field Electron Emission," Wikipedia, Categories: Quantum Mechanics/ Electrical Engineering, Last modified Jul. 1, 2012, 22 pages, retrieved Jul. 5, 2012, <http:en.wikipedia.org/w/index.php?title=Field_electron_emissions&oldid=500209692>.

*Primary Examiner* — Brett Feeney
*Assistant Examiner* — Sophia Nguyen
(74) *Attorney, Agent, or Firm* — Slater Matsil, LLP

(57) ABSTRACT

In one embodiment of the present invention, an electronic device includes a first emitter/collector region and a second emitter/collector region disposed in a substrate. The first emitter/collector region has a first edge/tip, and the second emitter/collector region has a second edge/tip. A gap separates the first edge/tip from the second edge/tip. The first emitter/collector region, the second emitter/collector region, and the gap form a field emission device.

26 Claims, 51 Drawing Sheets

(51) Int. Cl.
  *H01L 23/00*  (2006.01)
  *H02H 9/04*  (2006.01)

(56) References Cited

U.S. PATENT DOCUMENTS

| | | | | |
|---|---|---|---|---|
| 5,097,231 | A * | 3/1992 | Johnson | H01T 2/00 |
| | | | | 313/309 |
| 5,156,988 | A * | 10/1992 | Mori | H01J 9/025 |
| | | | | 438/20 |
| 5,198,390 | A * | 3/1993 | MacDonald | B81C 1/0015 |
| | | | | 148/DIG. 50 |
| 5,204,588 | A * | 4/1993 | Ugajin | B82Y 10/00 |
| | | | | 257/E29.168 |
| 5,357,397 | A | 10/1994 | Leary | |
| 5,371,431 | A * | 12/1994 | Jones | H01J 1/3042 |
| | | | | 313/309 |
| 5,393,375 | A * | 2/1995 | MacDonald | B81C 1/00531 |
| | | | | 148/DIG. 135 |
| 5,397,904 | A * | 3/1995 | Arney | B82Y 10/00 |
| | | | | 257/417 |
| 5,426,070 | A * | 6/1995 | Shaw | G01P 15/0802 |
| | | | | 216/2 |
| 5,448,132 | A * | 9/1995 | Komatsu | 313/495 |
| 5,508,584 | A * | 4/1996 | Tsai | H01J 29/085 |
| | | | | 313/307 |
| 5,515,234 | A * | 5/1996 | Frazier | H05F 3/04 |
| | | | | 361/212 |
| 5,627,427 | A * | 5/1997 | Das et al. | 313/308 |
| 5,653,619 | A * | 8/1997 | Cloud et al. | 445/24 |
| 5,656,530 | A | 8/1997 | Leary | |
| 5,691,550 | A * | 11/1997 | Kohyama | 257/301 |
| 5,719,073 | A * | 2/1998 | Shaw et al. | 438/53 |
| 5,770,513 | A * | 6/1998 | Okaniwa | H01L 23/34 |
| | | | | 257/E23.011 |
| 5,844,370 | A * | 12/1998 | Cathey | H01J 3/022 |
| | | | | 313/496 |
| 5,847,496 | A * | 12/1998 | Nakamoto | H01J 21/105 |
| | | | | 313/309 |
| 5,857,885 | A * | 1/1999 | Laou et al. | 445/24 |
| 5,898,258 | A * | 4/1999 | Sakai et al. | 313/309 |
| 5,933,718 | A | 8/1999 | El-Kareh et al. | |
| 5,946,176 | A | 8/1999 | Ghoshal | |
| 5,965,971 | A * | 10/1999 | Karpov | H01J 1/3042 |
| | | | | 313/309 |
| 5,990,519 | A * | 11/1999 | Huang-Lu | H01L 23/60 |
| | | | | 257/355 |
| 5,990,612 | A * | 11/1999 | Konuma | H01J 1/02 |
| | | | | 313/309 |
| 6,000,280 | A * | 12/1999 | Miller et al. | 73/105 |
| 6,093,330 | A * | 7/2000 | Chong | B81C 1/00047 |
| | | | | 216/11 |
| 6,132,278 | A * | 10/2000 | Kang et al. | 445/14 |
| 6,180,536 | B1 * | 1/2001 | Chong | B81C 1/00587 |
| | | | | 366/DIG. 3 |
| 6,239,473 | B1 * | 5/2001 | Adams | B81C 1/00142 |
| | | | | 257/254 |
| 6,255,771 | B1 * | 7/2001 | Jones | H01J 3/022 |
| | | | | 313/306 |
| 6,346,776 | B1 * | 2/2002 | Robinson et al. | 315/169.3 |
| 6,388,300 | B1 * | 5/2002 | Kano et al. | 257/419 |
| 6,410,962 | B2 | 6/2002 | Geissler et al. | |
| 6,417,016 | B1 * | 7/2002 | Gilton et al. | 438/20 |
| 6,497,141 | B1 * | 12/2002 | Turner et al. | 73/105 |
| 6,586,889 | B1 * | 7/2003 | Yaniv et al. | 315/169.3 |
| 6,648,710 | B2 * | 11/2003 | Milligan et al. | 445/50 |
| 6,692,323 | B1 * | 2/2004 | Moradi et al. | 445/24 |
| 6,767,614 | B1 * | 7/2004 | Hofmann et al. | 428/166 |
| 6,787,052 | B1 * | 9/2004 | Vaganov | 216/57 |
| 7,022,617 | B2 * | 4/2006 | Subramanian et al. | 438/719 |
| 7,166,488 | B2 * | 1/2007 | MacDonald | B81C 1/00492 |
| | | | | 257/E21.218 |
| 7,504,757 | B2 * | 3/2009 | Subramanian et al. | 310/309 |
| 8,063,393 | B2 * | 11/2011 | Chen | B82Y 10/00 |
| | | | | 257/4 |
| 8,134,277 | B2 * | 3/2012 | Moidu | 310/309 |
| 8,279,572 | B2 * | 10/2012 | Ding | H01L 23/60 |
| | | | | 361/112 |
| 8,383,489 | B2 * | 2/2013 | Huang | H01L 21/76254 |
| | | | | 257/E21.546 |
| 8,425,787 | B2 * | 4/2013 | Pan et al. | 216/27 |
| 9,380,688 | B1 * | 6/2016 | Feng | H05F 3/04 |
| 2002/0132490 | A1 * | 9/2002 | Sheng | 438/733 |
| 2003/0089979 | A1 * | 5/2003 | Malinowski | H01L 23/60 |
| | | | | 257/724 |
| 2003/0136660 | A1 * | 7/2003 | Gnade | A61L 2/08 |
| | | | | 204/164 |
| 2004/0027779 | A1 * | 2/2004 | Byrne | H05K 1/026 |
| | | | | 361/220 |
| 2005/0064650 | A1 * | 3/2005 | Kuo et al. | 438/222 |
| 2005/0104185 | A1 * | 5/2005 | Shimogishi | F25B 21/00 |
| | | | | 257/686 |
| 2006/0004966 | A1 | 1/2006 | Maeda et al. | |
| 2006/0234406 | A1 * | 10/2006 | Tseng | H01L 27/0255 |
| | | | | 438/20 |
| 2009/0091233 | A1 * | 4/2009 | Te-Pang | H01T 21/00 |
| | | | | 313/243 |
| 2009/0280585 | A1 * | 11/2009 | Koh | H01J 9/025 |
| | | | | 438/20 |
| 2009/0309230 | A1 * | 12/2009 | Cui | H01L 21/02115 |
| | | | | 257/773 |
| 2010/0079051 | A1 * | 4/2010 | Kim et al. | 313/311 |
| 2011/0023941 | A1 * | 2/2011 | DiDomenico | H01L 31/0352 |
| | | | | 136/246 |
| 2011/0049092 | A1 * | 3/2011 | Pan et al. | 216/27 |
| 2011/0089540 | A1 * | 4/2011 | Drost | H01L 23/60 |
| | | | | 257/660 |
| 2011/0094315 | A1 * | 4/2011 | Darty et al. | 73/862.68 |
| 2013/0271037 | A1 * | 10/2013 | Jeong et al. | 315/307 |
| 2014/0117470 | A1 * | 5/2014 | Baskaran | H01L 29/84 |
| | | | | 257/415 |
| 2015/0001671 | A1 * | 1/2015 | In 't Zandt | H01L 21/74 |
| | | | | 257/506 |
| 2015/0002966 | A1 * | 1/2015 | In 't Zandt | H01J 9/025 |
| | | | | 361/56 |
| 2015/0371810 | A1 * | 12/2015 | Guerrera | H01J 37/065 |
| | | | | 250/396 R |
| 2016/0009547 | A1 * | 1/2016 | Mason | B81B 7/02 |
| | | | | 257/415 |

* cited by examiner

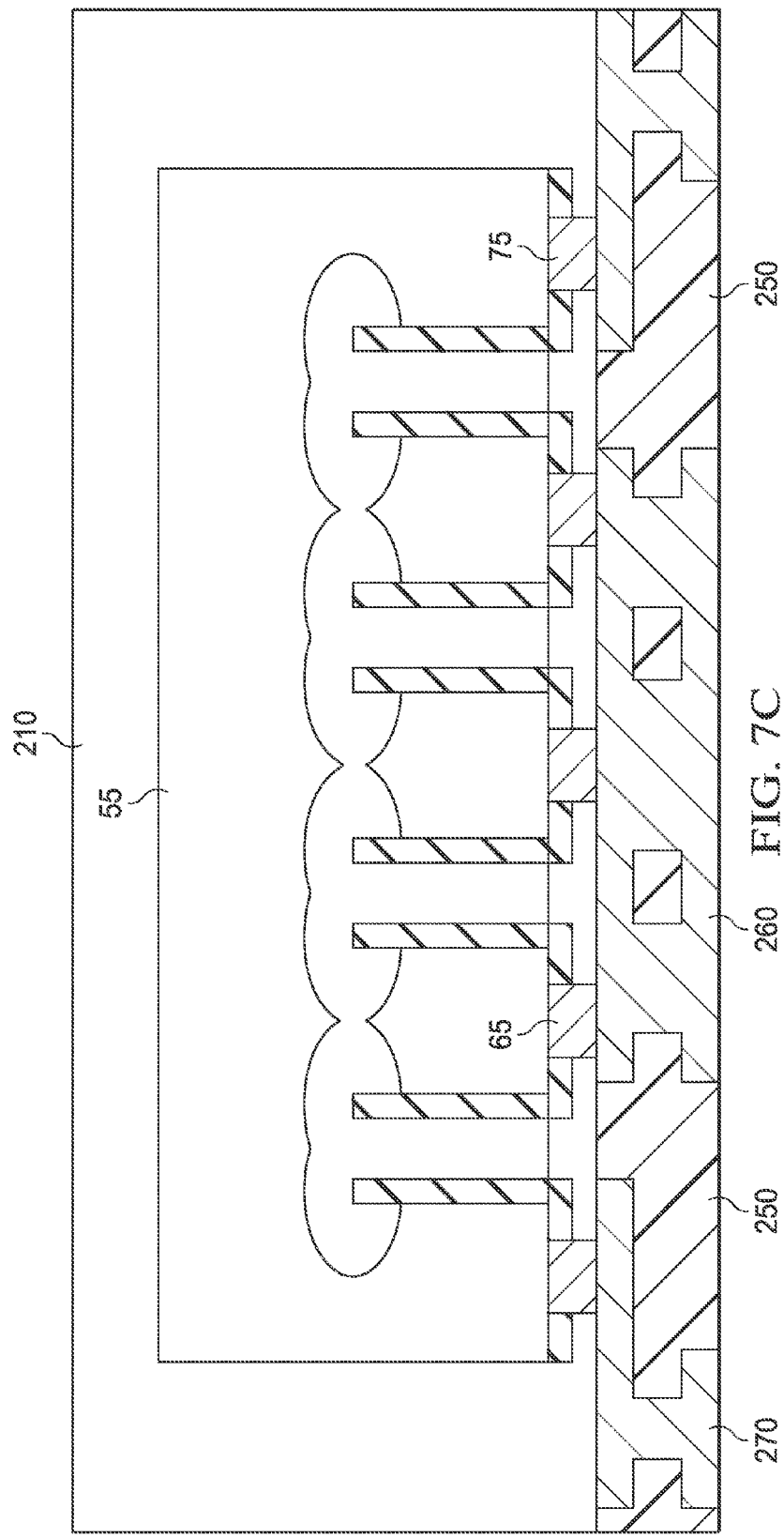

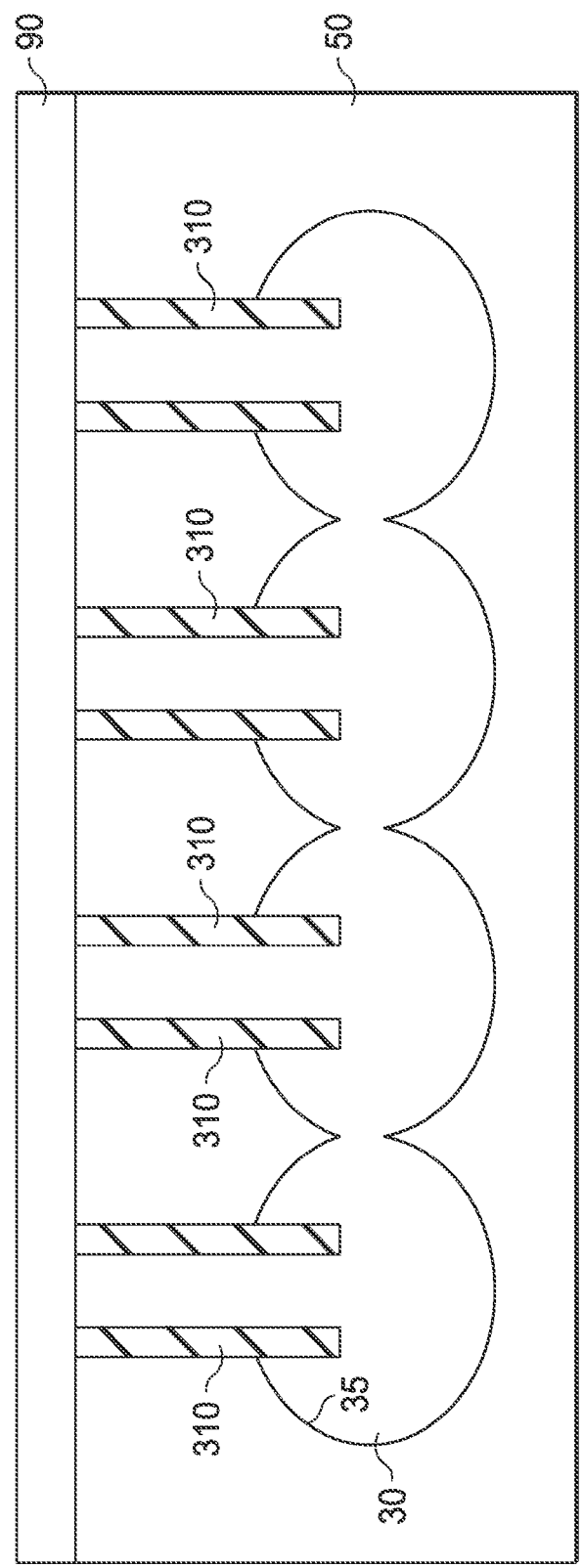

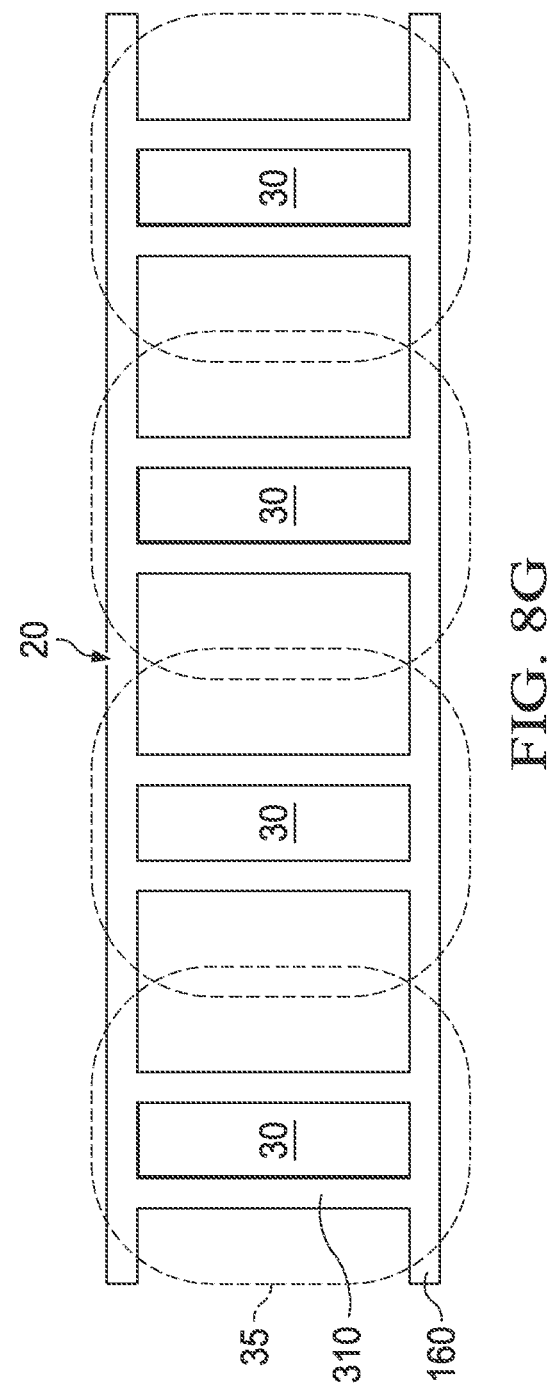

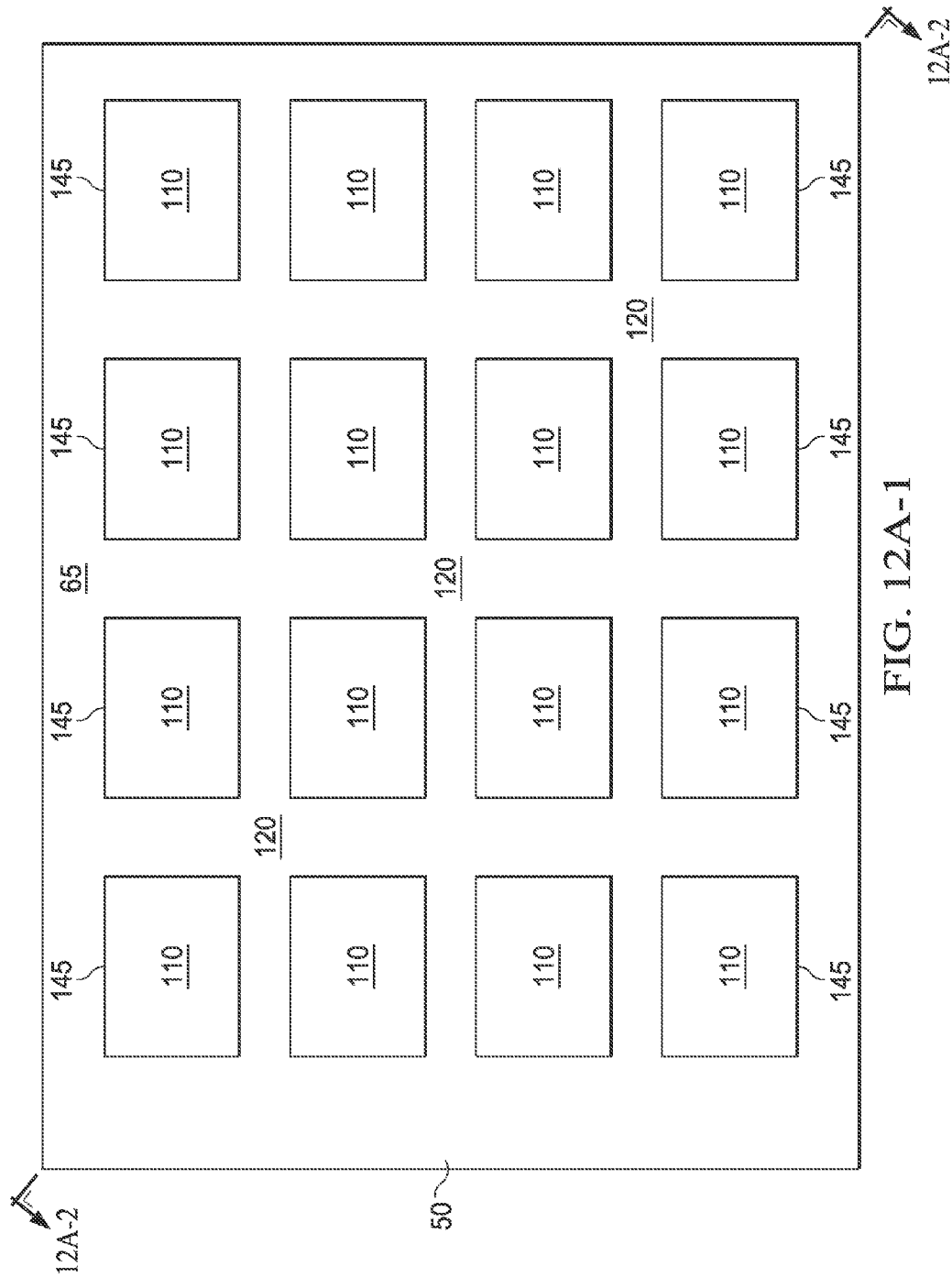

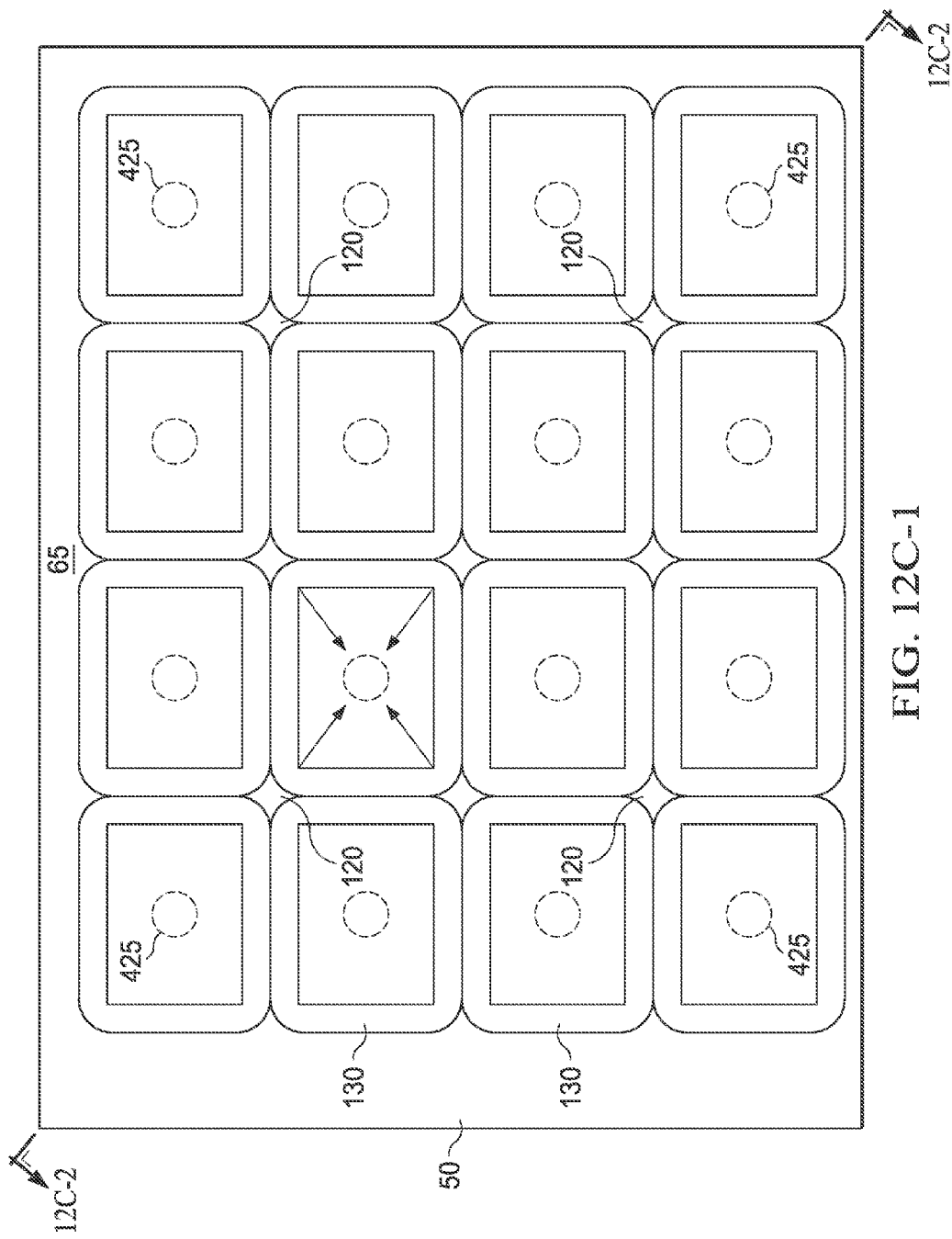

FIELD EMISSION DEVICES AND METHODS OF MAKING THEREOF

TECHNICAL FIELD

The present invention relates generally to electronic devices, and more particularly to field emission devices and methods of making thereof.

BACKGROUND

As electronic components are getting smaller and smaller along with the internal structures in integrated circuits, it is getting easier to either completely destroy or otherwise impair electronic components. In particular, many integrated circuits are highly susceptible to damage from the discharge of static electricity. Generally, electrostatic discharge (ESD) is the transfer of an electrostatic charge between bodies at different electrostatic potentials (voltages), caused by direct contact or induced by an electrostatic field. The discharge of static electricity, or ESD, has become a critical problem for the electronics industry.

When an ESD pulse occurs on a transistor or other active or passive devices, the extremely high voltage of the ESD pulse can break down the transistor and can potentially cause permanent damage. Consequently, the circuits associated with the input/output pads of an integrated circuit need to be protected from ESD pulses so that they are not damaged.

Device failures that result from ESD events are not always immediately catastrophic or apparent. Often, the device is only slightly weakened but is less able to withstand normal operating stresses and, hence, may result in a reliability problem. Therefore, various ESD protection circuits are included in the device to protect the various components.

ESD protection devices are designed based on the type of component that is being protected. However, designing ESD protection devices requires overcoming a number of limitations imposed by the need to reduce the device area without reducing the required voltage protection and response time.

SUMMARY OF THE INVENTION

In accordance with an embodiment of the present invention, an electronic device comprises a first emitter/collector region and a second emitter/collector region disposed in a substrate. The first emitter/collector region has a first edge/tip, and the second emitter/collector region has a second edge/tip. A gap separates the first edge/tip from the second edge/tip. The first emitter/collector region, the second emitter/collector region, and the gap form a field emission device.

In accordance with an alternative embodiment of the present invention, an electronic device comprises a first trench disposed in a substrate, a first cavity disposed in the substrate under the first trench, and a second trench proximate the first trench. A second cavity is disposed in the substrate under the second trench. The first cavity intersects the second cavity at a first edge/tip and a second edge/tip. The first edge/tip and the second edge/tip form part of a field emission device.

In accordance with an alternative embodiment of the present invention, a method of forming an electronic device comprises forming a first trench and a second trench in a substrate, and forming a first edge/tip and a second edge/tip by forming a first cavity under the first trench and a second cavity under the second trench. The first cavity intersects with the second cavity to form the first edge/tip and the second edge/tip. The first edge/tip is opposite the second edge/tip. The first edge/tip and the second edge/tip form part of a first field emission device.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1D, illustrates an ESD device in accordance with embodiments of the invention, wherein FIG. 1A illustrates a schematic of the ESD device used to protect a circuit, wherein FIG. 1B illustrates a schematic circuit of the ESD protection device, wherein FIGS. 1C and 1D illustrate a structural embodiment of the ESD protection device;

FIGS. 2A and 2B, illustrates a field emission ESD device in accordance with an alternative embodiment of the present invention, wherein FIG. 2A illustrates a cross-sectional view, and wherein FIG. 2B illustrates a top view;

FIG. 3, which includes

FIG. 4, which includes FIGS. 4A-4B, illustrates a field emission ESD device in accordance with an alternate embodiment of the present invention, wherein FIG. 4A illustrates a cross-sectional view, and wherein FIG. 4B illustrates a top view;

FIG. 5, which includes

FIG. 6, which includes FIG. 6A-6J, illustrates a field emission device during various stages of processing in accordance with an alternative embodiment of the present invention;

FIG. 7, which includes FIG. 7A-7C, illustrates a field emission device in accordance with an alternative embodiment of the present invention;

FIG. 8, which includes FIGS. 8A-8G, illustrates a field emission device during various stages of fabrication in accordance with an alternative embodiment of the present invention;

FIG. 9, which includes

FIG. 10, which includes

FIG. 12, which includes

FIG. 13, which includes

FIG. 16, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of contexts. The embodiments discussed are merely illustrative of a few ways to make and use the invention, and do not limit the scope of the invention. Although described below as ESD devices, the field emission devices described in various embodiments may be used for other applications.

A structural embodiment of the invention will be described in FIG. 1. Further structural embodiments of the invention will be described using FIGS. 2-4. Various embodiments of methods of fabricating the devices will be described using FIGS. 5-6, and 8-12. Various embodiments of the package will be described using FIGS. 7, and 13-16.

Figure 1A:
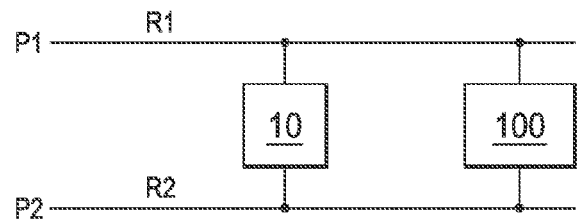
Figure 1B:
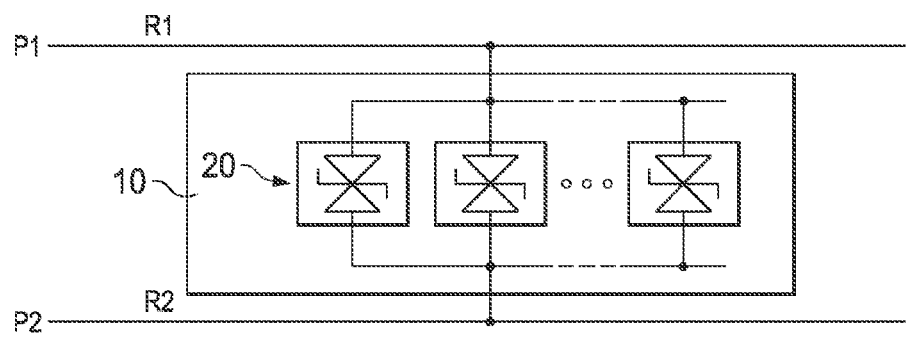
Figure 1C:
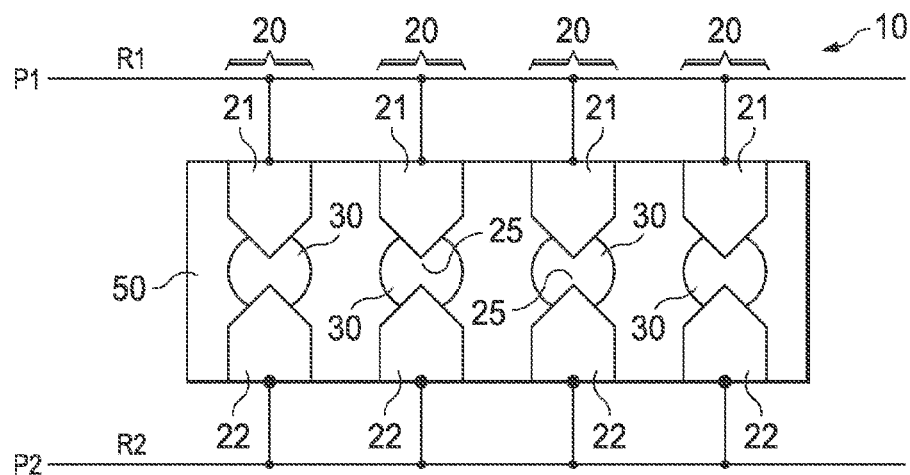
Figure 1D:
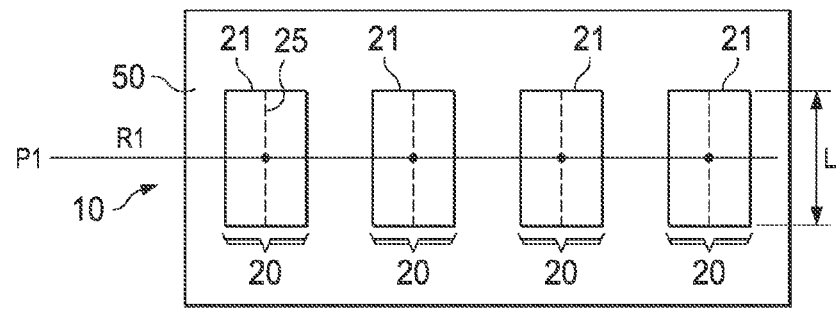

FIG. 1, which includes FIGS. 1A-1D, illustrates an ESD device in accordance with embodiments of the invention, wherein FIG. 1A illustrates a schematic of the ESD device used to protect a circuit, wherein FIG. 1B illustrates a schematic circuit of the ESD protection device, wherein FIGS. 1C and 1D illustrate a structural embodiment of the ESD protection device.

FIG. 1A is a schematic illustration of an ESD device used to protect a circuit in accordance with embodiments of the invention.

As illustrated in FIG. 1A, the ESD device 10 is coupled in parallel to the circuitry 100 to be protected between a first voltage rail R1 and a second voltage rail R2. The circuitry 100 to be protected could be any type of circuit. Examples include logic, analog, mixed signal, memory, power circuits including internal buffers, drivers, etc.

Referring to FIG. 1A, an ESD device 10 is triggered when an ESD pulse occurs on the pads P1 or P2. The pads P1/P2 may be pins of a printed circuit board in one embodiment. In the absence of an ESD pulse, the ESD device 10 is in the "off" position and does not conduct any current. When the pads P1 or P2 is zapped with an ESD pulse, the ESD device 10 is triggered "on" by the ESD stress voltage to conduct an ESD current from the pad P1 to the pad P2 or vice versa. Thus, the charge from the ESD event is dissipated through a parallel ESD circuit protecting the circuitry 100 to be protected.

For effective ESD protection, the ESD device must be triggered at a voltage less than the breakdown voltage of the circuitry 100 being protected. For example, in case of a MOS transistor this breakdown voltage is typically the gate oxide breakdown voltage. Hence, to protect a MOS transistor in the circuitry 100, the ESD device must turn on at a voltage (trigger voltage) less than the gate oxide breakdown voltage.

The ESD device must also respond in the same time scales as the ESD pulse, which may be a few nanoseconds. A faster trigger speed is advantageous as it avoids harm to the circuitry 100 during the rise of the ESD pulse before the ESD device 10 is turned on. The ESD device 10 has to be also robust over the operating temperature range.

In addition, the holding voltage and "on" resistance of ESD device 10 will impact the robustness of the protection. A lower holding voltage and smaller resistance provide a more robust protection. However, the holding voltage must be higher than the operating voltage (VDD) of the circuitry 100 to avoid hindering its operation under normal operating conditions.

As a consequence, the ESD device 10 has to be matched with the requirements of the circuitry 100 to be protected. For example, an ESD device used to protect a high voltage device may require higher triggering and holding voltages than an ESD device used to protect a low voltage device.

Embodiments achieve fast responses (less than nanoseconds) while allowing flexibility in achieving various trigger and hold voltages based on the circuitry 100 being protected. In various embodiments, one or more field emission devices are used for ESD protection.

FIG. 1B illustrates a schematic circuit of the ESD device in accordance with various embodiments of the present invention.

Referring to FIG. 1B, the ESD device 10 includes a plurality of field emission devices 20 coupled in parallel between the first voltage rail R1 and the second voltage rail R2. In various embodiments, as described further below, the plurality of field emission devices 20 include plates, edges, and/or tips separated by vacuum or gas such that on the application of an electric field induced by an ESD pulse, the plurality of field emission devices 20 begin to conduct due to the phenomena of field emission. This conduction through the plurality of field emission devices 20 reduces the voltage potential at the circuitry 100 to be protected thereby preventing damage to the circuitry 100. In various embodiments, advantageously, the plurality of field emission devices 20 are symmetric, i.e., the plurality of field emission devices 20 may be triggered by an ESD pulse applied on the first voltage rail R1 or the second voltage rail R2. Therefore, embodiments of the invention avoid the need for using two ESD devices as is used conventionally.

FIGS. 1C and 1D illustrate an implementation of the field emission ESD protection device in accordance with embodiments of the invention, wherein FIG. 1C illustrates a cross-sectional view and wherein FIG. 1D illustrates a top view.

FIG. 1C illustrates a schematic structural implementation of the field emission ESD device in accordance with various embodiments of the present invention.

Referring to FIG. 1C, each of the plurality of field emission devices 20 comprise a first emitter/collector region 21 and a second emitter/collector region 22 separated from each other by a gap 30. The first emitter/collector region 21 and the second emitter/collector region 22 are disposed within a substrate 50. The substrate 50 may comprise a bulk silicon substrate, for example, having a (100) surface. In various embodiments, the substrate 50 may comprise a semiconductor on insulator (SOI) material such as silicon on oxide. In one or more embodiments, the substrate may be doped with a n-type or p-type doping to reduce resistance.

In one or more embodiments, the substrate may comprise other semiconductor materials such as SiGe, SiC, graphene, including compound semiconductors such as GaN, GaAs, GaP, GaSb, InP, InSb, SbAs, and combinations thereof. In alternative embodiments, the substrate 50 may comprise metallic materials.

In one or more embodiments, the first and the second emitter/collector regions 21 and 22 may comprise the same material as the material of the substrate 50. In alternative embodiments, the first and the second emitter/collector regions 21 and 22 may comprise a different material than the substrate 50 or other dielectric materials such as glass.

The first and the second emitter/collector regions 21 and 22 have an inclined surface forming an edge 25, which is a one-dimensional (1-D) line rather than a tip. The field emission occurs between the edge 25 of the first emitter/collector region 21 and the corresponding edge 25 of the second emitter/collector region 22 because the electric field is highest between these edges 25. Therefore, the current flowing through the gap 30 between the first emitter/collector region 21 and the second emitter/collector region 22 is proportional to the surface area of the edge 25. To safely discharge an ESD pulse, large amount of current (e.g., a few amps) has to flow through the field emission device. However, if the edge 25 has a zero-dimensional shape (e.g., a pointed tip having a radius of 10 nm-50 nm), the current flowing through the field emission device is very small (few micro amps), which is not sufficient to discharge an ESD pulse. If a field emission device with a pointed tip is used, large numbers of such devices (>1000) are needed to form a suitable ESD device. However, this prohibitively increases the chip area and therefore the cost of the ESD device. As further illustrated in FIG. 1D, embodiments of the invention dramatically increase the current flowing through the ESD device by using a one-dimensional shape for the edge 25.

In various embodiments, the gap 30 may be a void within the substrate 50. In one or more embodiments, the gap 30 is hermetically sealed in to avoid interference from the operating environment. The gap 30 may comprise vacuum or a gas at low pressures to avoid ionization of the gas, which may damage the device. For example, pressures less than 1 atm (e.g., 0.1 atm-0.5 atm) may be used in various embodiments.

FIG. 1D illustrates a top view of the field emission ESD device illustrated in FIG. 1C in accordance with embodiments of the present invention.

As illustrated in FIG. 1D, the edge 25 of the first emitter/collector region 21 extends laterally over a length L. The edge 25 of the second emitter/collector region 22 similarly extends laterally underneath the edge 25 of the first emitter/collector region 21. In various embodiments, the length L of the edge 25 may be about 1 µm to about 100 µm. In one or more embodiments, the length L of the edge 25 may be about 1 µm to about 10 µm. In one or more embodiments, the length L of the edge 25 may be about 0.5 µm to about 5 µm. Therefore, advantageously, compared to a pointed top of about 10 nm, the edge 25 can conduct 100 times to about 10,000 times more current.

Figure 2A:
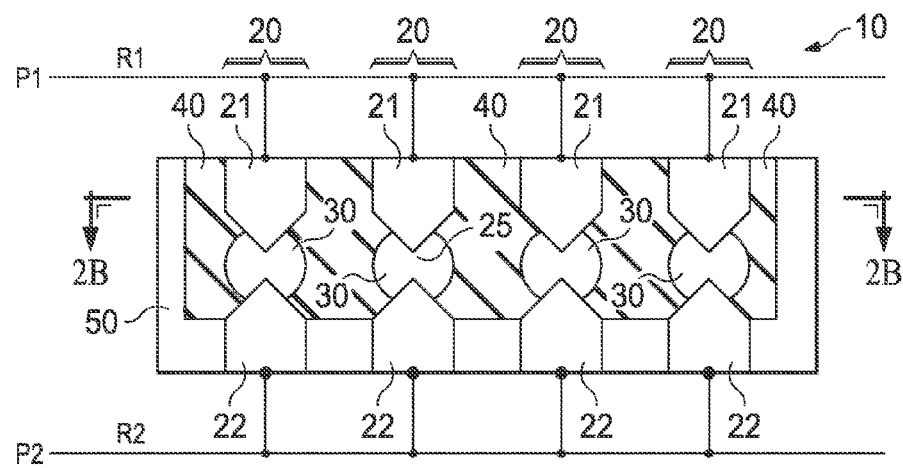
Figure 2B:
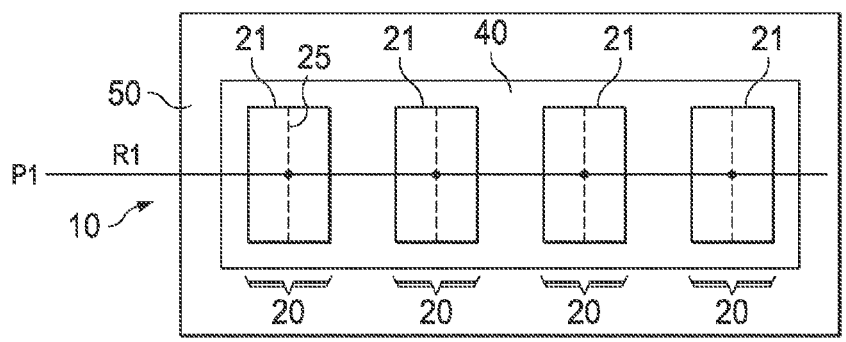
Figures 2, 12A:
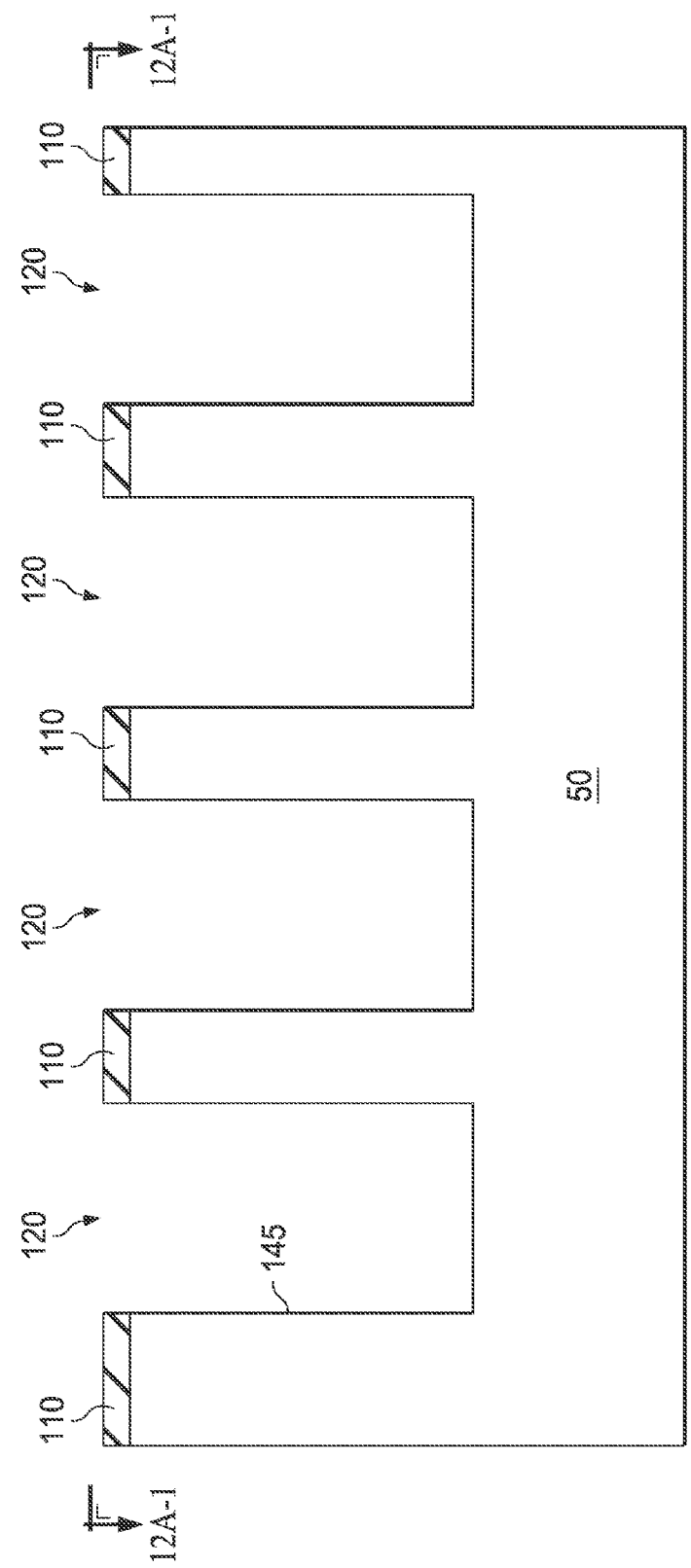
FIG. 2, which includes
FIGS. 12A-12D, illustrates a field emission device during fabrication in accordance with an alternative embodiment of the invention.

FIG. 2, which includes FIGS. 2A and 2B, illustrates a field emission ESD device in accordance with an alternative embodiment of the present invention, wherein FIG. 2A illustrates a cross-sectional view, and wherein FIG. 2B illustrates a top view.

As illustrated in FIG. 2A, the plurality of field emission devices 20 may be isolated from each other as well as from other components in the substrate by an insulating layer 40. The insulating layer 40 may comprise a suitable dielectric material such as an oxide, nitride, and other isolating dielectric materials and may comprise a plurality of layers.

Figure 3A:
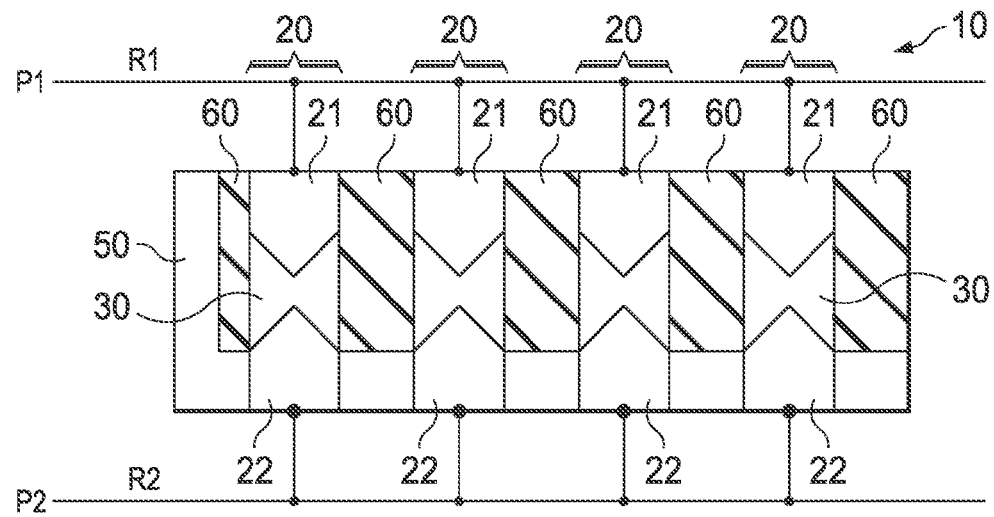
FIGS. 3A and 3B, illustrates cross-sectional views of field emission ESD devices in accordance with an alternative embodiment of the present invention.
Figure 3B:
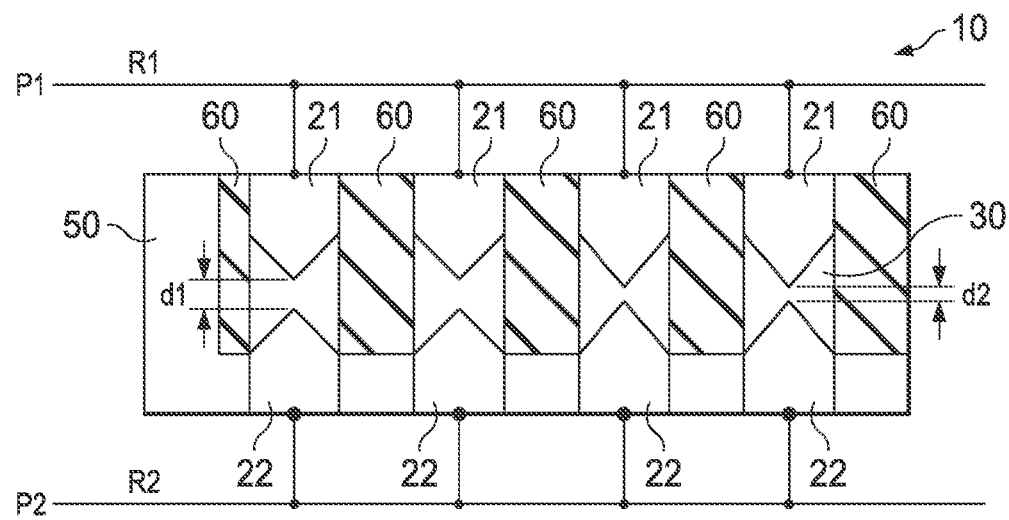

FIG. 3, which includes FIGS. 3A and 3B, illustrates cross-sectional views of field emission ESD devices in accordance with an alternative embodiment of the present invention.

FIG. 3A illustrates a plurality of field emission devices isolated from each other as well as from other components using trench isolation region 60. To enhance isolation, the trench isolation region 60 may extend past the edge 25 of the first emitter/collector region 21 in one or more embodiments. In alternative embodiments, the trench isolation region 60 may extend past the edge 25 of the second emitter/collector region 22.

FIG. 3B illustrates a plurality of field emission devices 20 having different operating characteristics. The trigger voltage and the hold voltage of the plurality of field emission devices 20 depend, amongst other things, on the distance of the 30 between the edge 25 of the first emitter/collector region 21 and the edge 25 of the second emitter/collector region 22. FIG. 3B illustrates a first set of devices having a first distance d1 and a second set of devices having second distance d2. In various embodiments, the first distance d1 and the second distance d2 may be about 10 nm to about 1000 nm. For example, the first set of devices may be configured to protect a first type of circuit while the second set of devices may be configured to protect the second type of circuit. As an illustration, the first type of circuit may be a low voltage circuit, for example, having a drive voltage less than about 1.5 V (e.g., 0.8 V-1.2 V) while the second set of circuit may be a high voltage circuit, for example, having a drive voltage more than about 1.5 V (e.g., 3 V-20 V). The first set of devices and the second set of devices may be coupled between the same voltage rails (as illustrated) or to separate voltage rails in some embodiments.

Figure 4A:
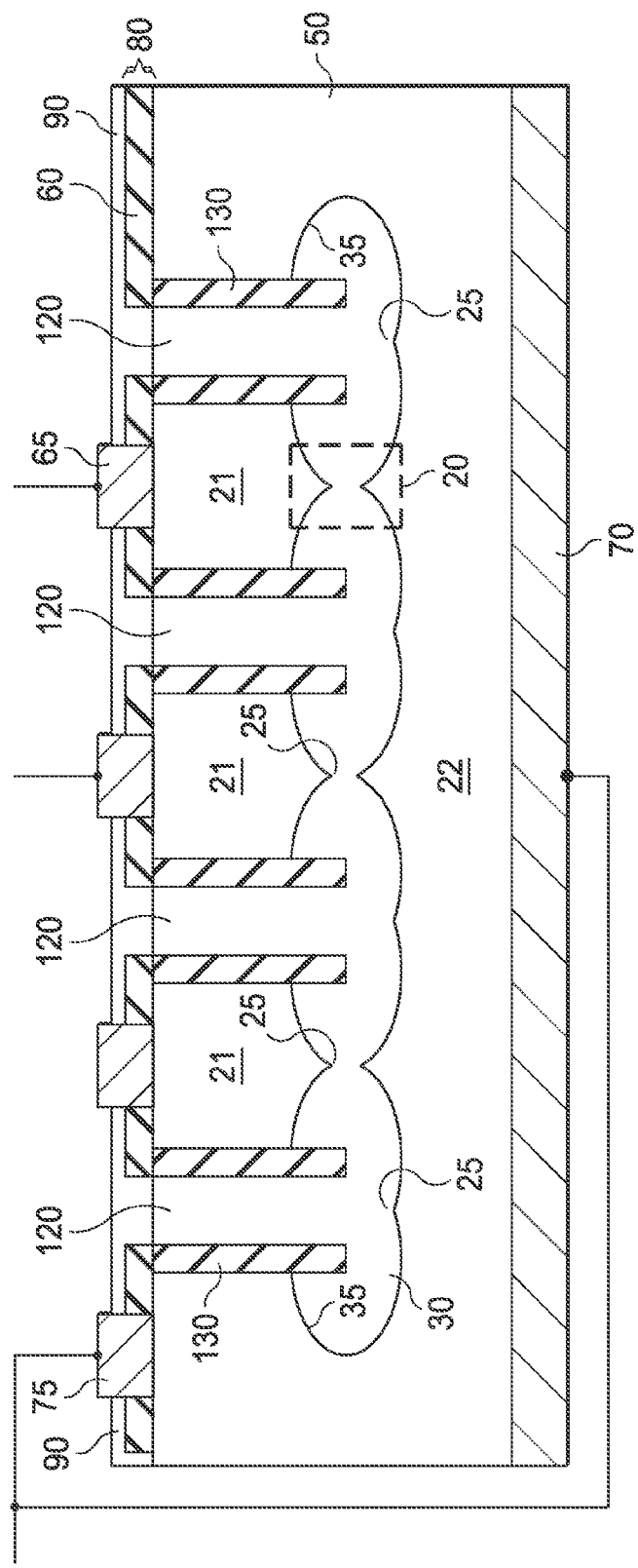
Figure 4B:
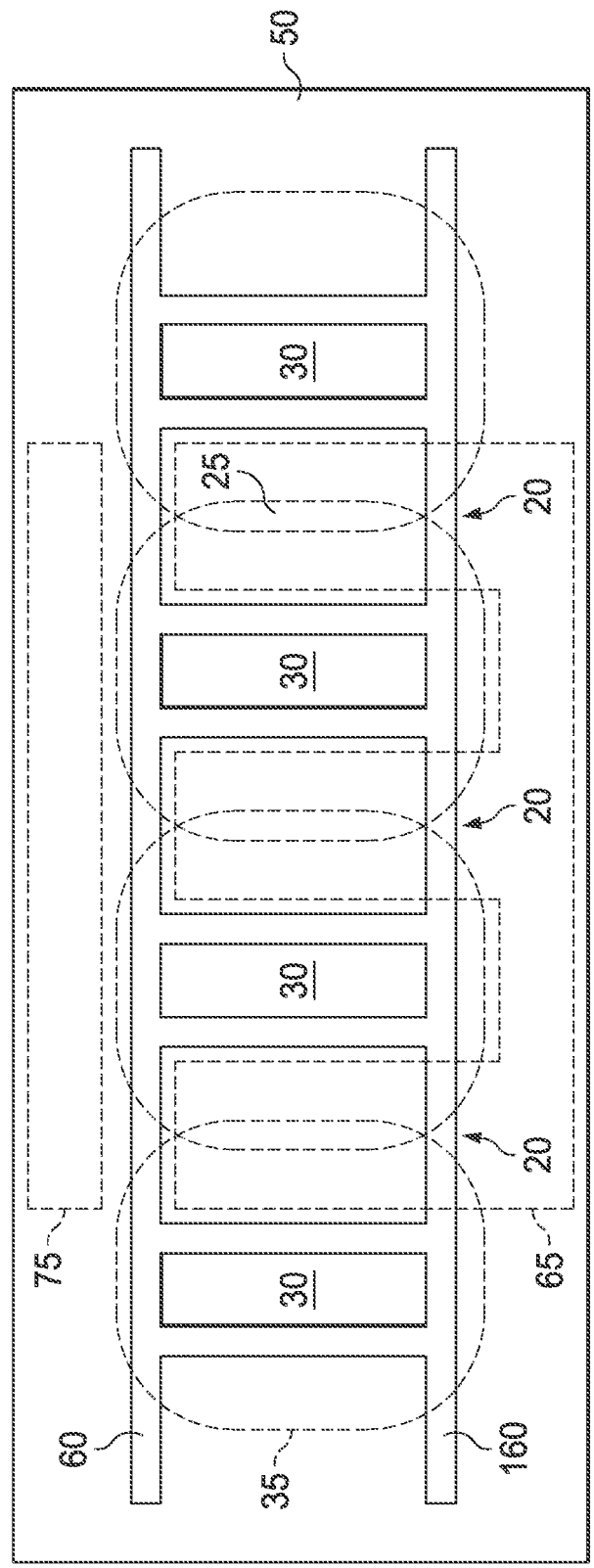

FIG. 4, which includes FIGS. 4A-4B, illustrates a field emission ESD device in accordance with an alternate embodiment of the present invention, wherein FIG. 4A illustrates a cross-sectional view, and wherein FIG. 4B illustrates a top view.

Referring to FIG. 4A, a plurality of trenches 120 is disposed within a substrate 50. The plurality of trenches 120 may have a depth of at least 1 µm in various embodiments. The plurality of trenches 120 may have a depth of about 1 µm to about 10 µm in various embodiments. The plurality of trenches 120 may have a depth of about 1 µm to about 5 µm in one or more embodiments. The plurality of trenches 120 may have a depth of about 0.5 µm to about 1 µm in some embodiments.

The sidewalls of the plurality of trenches 120 are lined with a sidewall spacer 130 thereby forming trench isolation regions 60. The sidewall spacer 130 may comprise an isolating material such as a dielectric. In one or more embodiments, the sidewall spacer 130 may comprise a nitride such as silicon nitride. In alternative embodiments, the sidewall spacer 130 may comprise an oxide such as silicon oxide.

The plurality of trenches 120 extend into a gap 30 having sidewalls 35 shaped like a balloon. The adjacent sidewalls 35 of the adjacent trenches of the plurality of trenches 120 intersect to form an edge 25. Thus, the adjacent trenches of the plurality of trenches 120 enclose a first emitter/collector region 21.

The sidewall spacer 130 helps to isolate the first emitter/collector region 21 from adjacent ones as well as from the second emitter/collector region 22. The sidewall spacer 130 extends into the gap 30 ensuring good isolation as well as to prevent field emission emanating from the sidewalls of the edge 25. Similarly, bottom sidewalls 35 of the gap 30 intersect to form an edge 25 of the second emitter/collector region 22.

The gap 30 and the plurality of trenches 120 may be sealed by a mask layer 80 and a capping layer 90. The first emitter/collector region 21 may be coupled to a first contact pad 65 while the second emitter/collector region 22 may be coupled through a back side conductive layer 70 and/or through a second contact pad 75.

FIG. 4B illustrates a top view of the field emission ESD device in which the plurality of field emission devices 20 is isolated by the sidewall spacer 130 and additionally by isolation trenches 160. FIG. 4B also illustrates that the sidewall 35 of adjacent trenches of the plurality of trenches intersect and thereby form edges 25 of the plurality of field emission devices 20.

The first contact pad 65 may be formed as a finger structure in some embodiments while the second contact pad may be placed parallel and/or perpendicular to the isolation trenches 160.

FIG. 5, which includes FIGS. 5A-5F, illustrates a field emission device during various stages of fabrication in accordance with embodiments of the present invention.

Figure 5A:
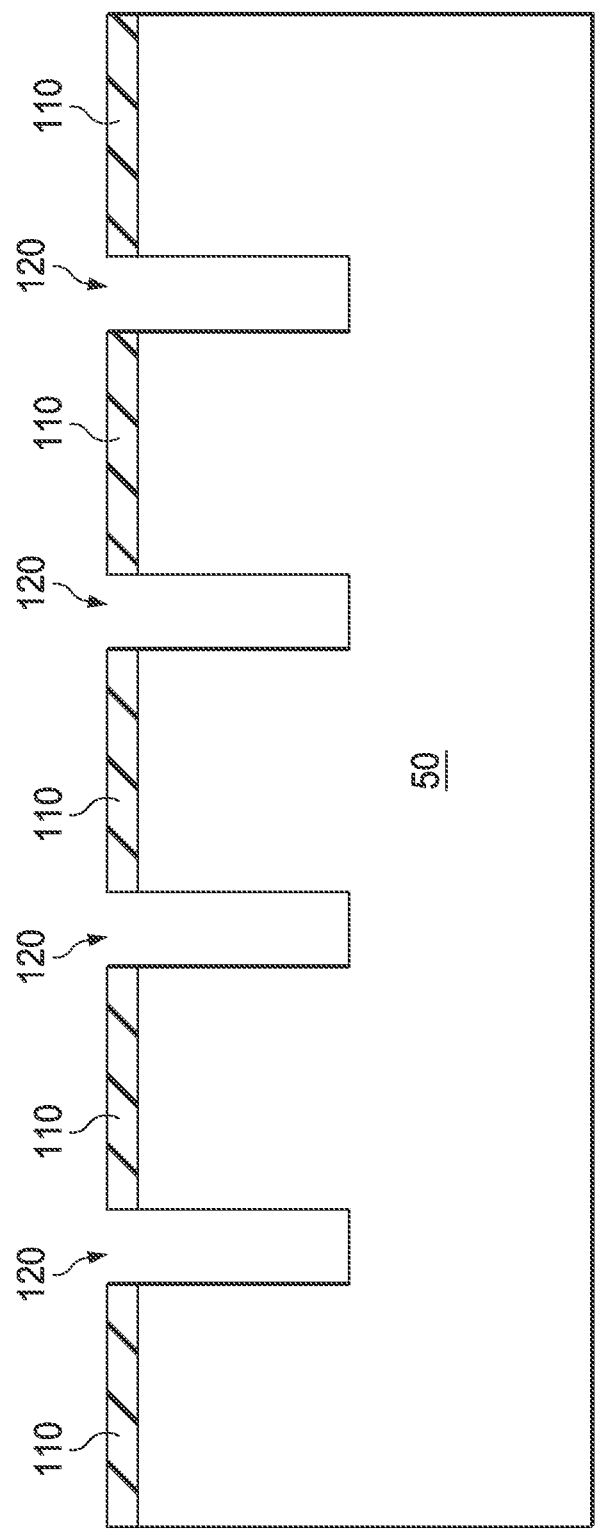
FIGS. 5A-5F, illustrates a field emission device during various stages of fabrication in accordance with embodiments of the present invention.

Referring to FIG. 5A, a plurality of trenches 120 are formed within a substrate 50. A hard mask layer 110 may be deposited over the substrate 50. Alternatively, a soft mask layer such as a resist be used instead of the hard mask layer 110. Such a mask layer may be removed after trench etching. The hard mask layer 110 may comprise a single layer or a plurality of layers in various embodiments. The hard mask layer 110 protects the substrate 50 during the subsequent trench etching process.

The hard mask layer 110 may be selected based on the selectivity to the etch process. The hard mask layer 110 may comprise an inorganic dielectric layer such as a silicon oxide layer in various embodiments. The hard mask layer 110 may comprise silicon nitride in one embodiment. In an alternative embodiment, the hard mask layer 110 may comprise an imide layer.

The hard mask layer 110 may have a thickness of about 100 nm to about 500 nm in various embodiments. In one or more embodiments, the hard mask layer 110 may have a thickness of about 100 nm to about 300 nm. In one or more embodiments, the hard mask layer 110 may have a thickness of about 100 nm to about 2000 nm. The hard mask layer 110 may be formed using deposition techniques or coated in various embodiments. The formation of the hard mask layer 110 may include a baking process. A resist layer may be deposited over the hard mask layer 110 and patterned using conventional lithography. The spacing between the plurality of trenches 120 may be adjusted in the patterning process. Using the patterned resist layer, the hard mask layer 110 is patterned as illustrated in FIG. 5A.

Using the patterned hard mask layer 110, a plurality of trenches 120 are formed in the substrate 50 using an etching process such as reactive ion etch process.

Figure 5B:
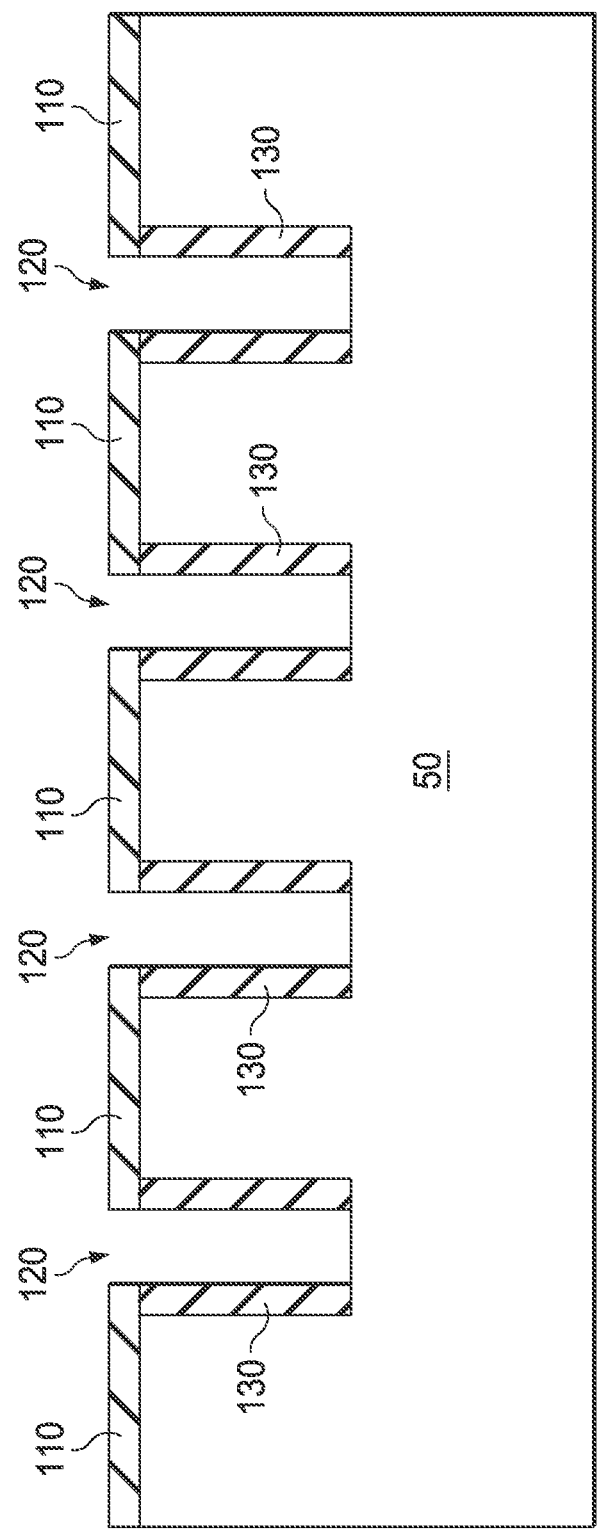

Referring to FIG. 5B, an insulating layer is deposited over the substrate 50. The insulating layer is etched using an anisotropic etch process so as to remove the insulating layer from the top surface of the patterned hard mask layer 110 thereby forming a sidewall spacer 130. In one or more embodiments, the sidewall spacer 130 comprises an oxide such as silicon oxide. In other embodiments, the sidewall spacer 130 may comprise a nitride such as silicon nitride as well as other insulating materials in one or more embodiments.

Figure 5C:
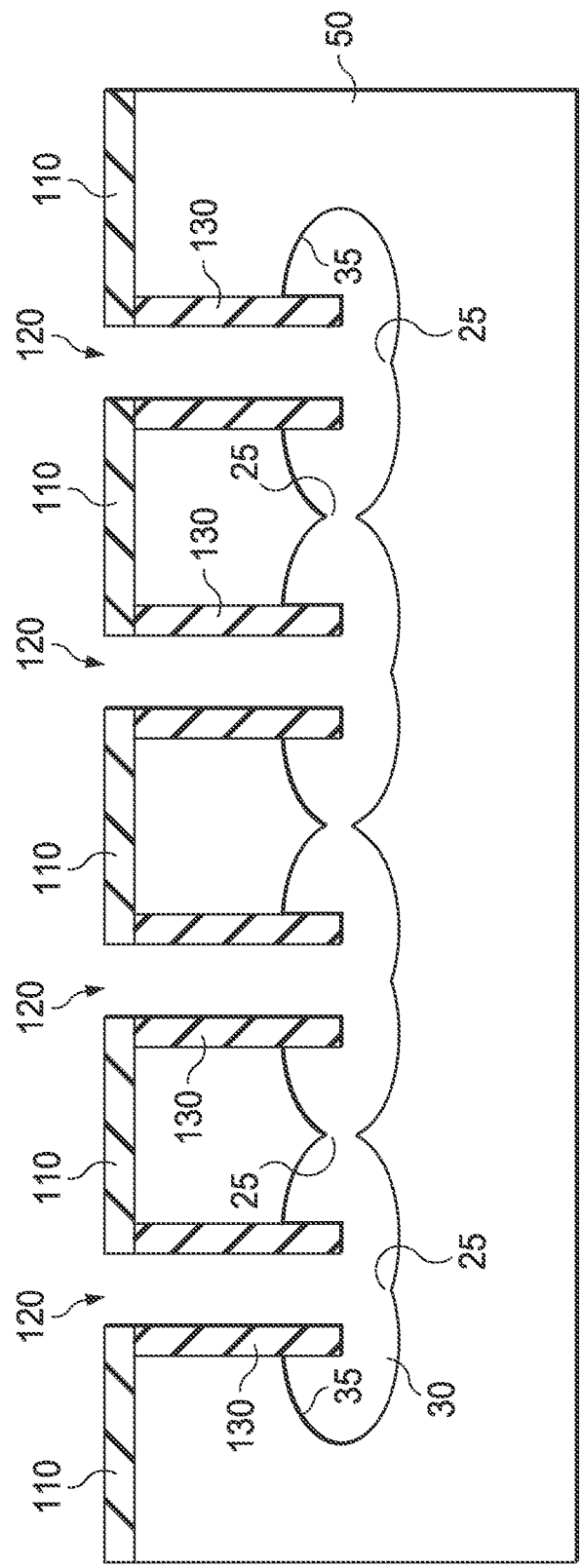

Referring next to FIG. 5C, the substrate 50 is exposed to an isotropic etch process. The chemistry of the isotropic etch is selected so as to etch the substrate 50 without considerably etching the sidewall spacer 130. In one or more embodiments, an etchant comprising nitric acid and hydrofluoric acid to be used to etch the substrate 50. Because of the isotropic nature of the etch, the substrate 50 is etched both vertically and laterally. For example, the etching laterally undercuts the sidewall spacer 130. Depending on the spacing between the adjacent trenches of the plurality of trenches 120, the lateral etch fronts of the adjacent trenches may intersect, which forms the edges 25 of the first and the second emitter/collector regions 21 and 22. This results in the formation of the wedge-shaped edges 25 of the first and the second emitter/collector regions 21 and 22 (see also FIG. 4B). The isotropic etch process may be timed to produce the desired shape and gap distance between the edges 25 of the first and the second emitter/collector regions 21 and 22.

Figure 5D:
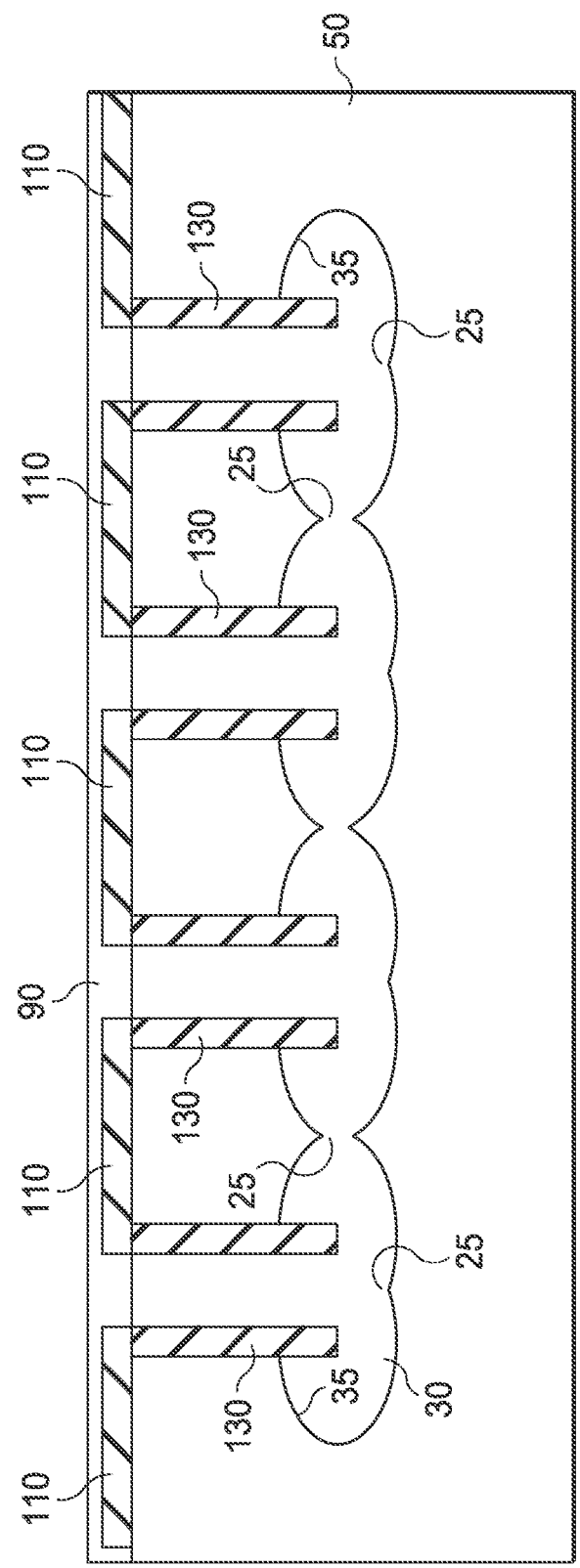

As next illustrated in FIG. 5D, the plurality of trenches 120 and the gap 30 are sealed. A capping layer 90 may be formed over the substrate 50. Optionally, in some embodiments, the remaining hard mask layer 110 may be removed prior to depositing the capping layer 90. The capping layer 90 may be formed using a vapor deposition process such as a high density plasma (HDP) chemical vapor deposition (CVD) process as well as spin coating processes. In various embodiments, the capping layer 90 may comprise an oxide such as a HTP oxide, doped glass such as BPSG, PSG, and BSG, and other materials. The doped glass may be coated using spin coating in one or more embodiments. The spin on glass may be deposited as a semi solid, and then baked and cured to form the capping layer 90. In various embodiments, care is taken to ensure that the sealing process does not fill the gap 30 and the plurality of trenches 120.

Figure 5E:
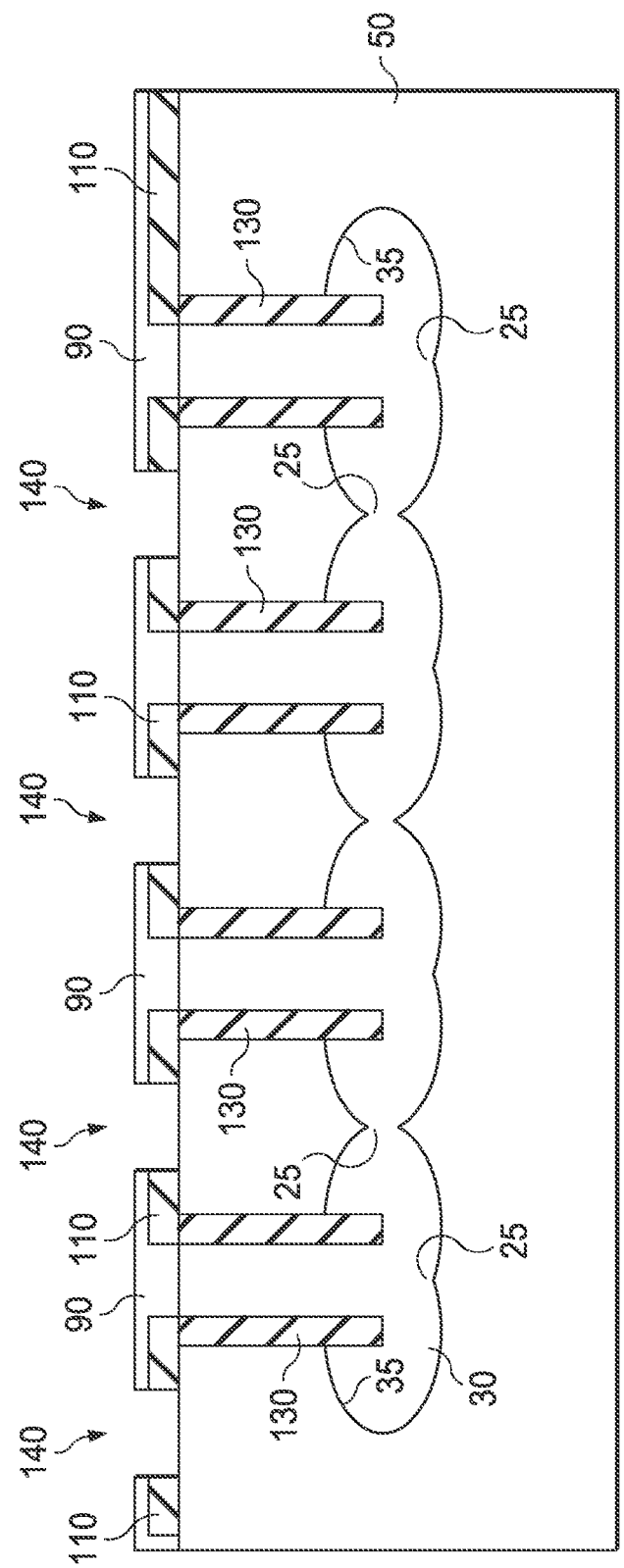

Referring to FIG. 5E, the capping layer 90 and any remaining hard mask layer 110 is patterned to form openings 140 for contacts. The patterning may be performed using conventional lithography processes, for example, by depositing a photoresist layer and patterning the same.

Figure 5F:
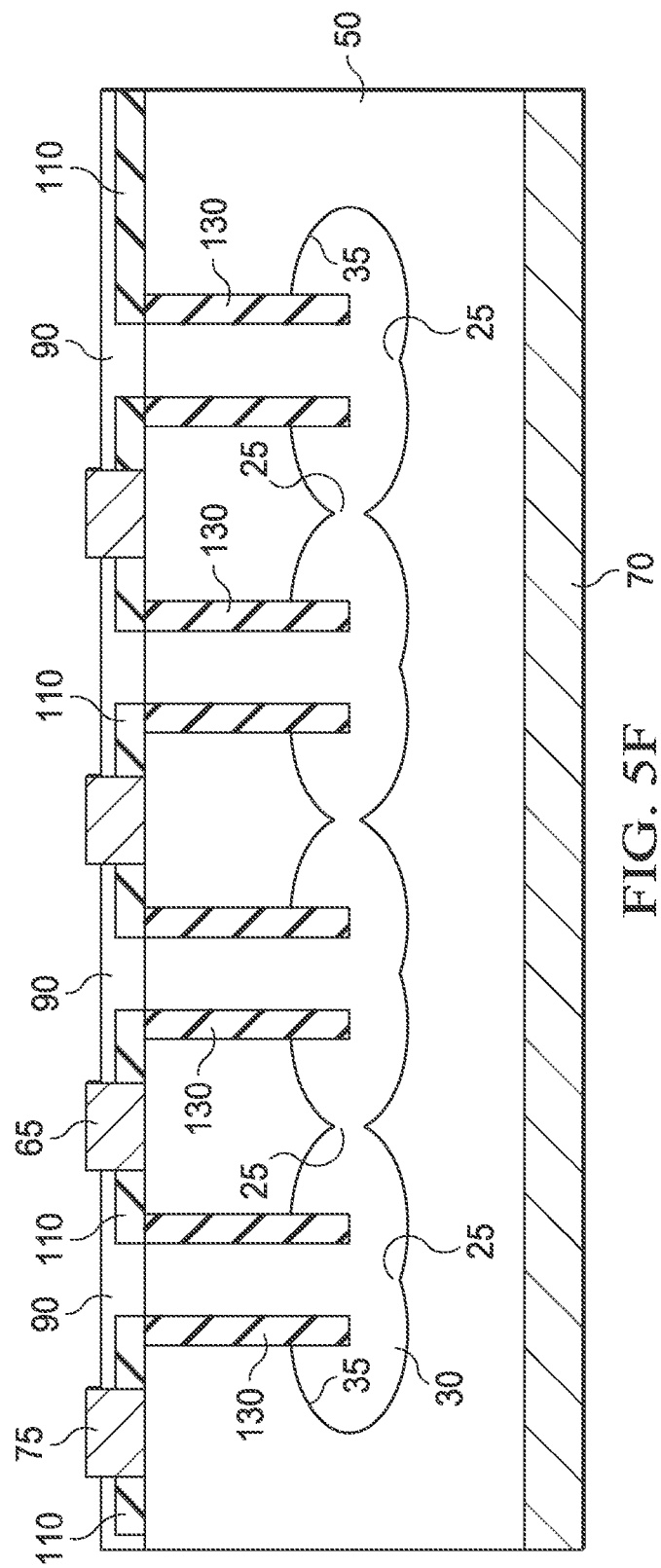

As next illustrated in FIG. 5F, contacts are formed within the openings 140. A first contact pad 65 is formed over the first emitter/collector region 21 while a second contact pad 75 may be used to contact the second emitter/collector region 22. The first and the second contact pads 65 and 75 may comprise aluminum in one embodiment. In an alternative embodiment, the first and the second contact pads 65 and 75 may comprise copper. A barrier metal liner such as titanium nitride, tantalum nitride, and/or tungsten may be deposited prior to the deposition of aluminum, copper in some embodiments. The first and the second contact pads 65 and 75 may also comprise a solder material in some embodiments. For example, in some embodiments, a solder material may be coated over the first and the second contact pads 65 and 75 to promote subsequent solder joint process. For example, in one embodiment, a lead (Pb) layer followed by a tin (Sn) layer may be formed over the first and the second contact pads 65 and 75. Other examples include SnAg, SnPbAg, SnPb, PbAg, PbIn, and lead free materials such as SnBi, SnAgCu, SnTn, and SiZn. In various embodiments, other suitable materials may be deposited.

The back side conductive layer 70 may be deposited under the substrate 50. In some embodiments, the substrate 50 may be thinned prior to depositing the back side conductive layer 70. In one embodiment, the top of this structure may be similar to that of FIG. 4B.

FIG. 6, which includes FIG. 6A-6J, illustrates a field emission device during various stages of processing in accordance with an alternative embodiment of the present invention.

Unlike the prior embodiment, in this embodiment, the metallization is performed prior to the formation of the field emission regions such as the edges and the gap.

Figure 6A:
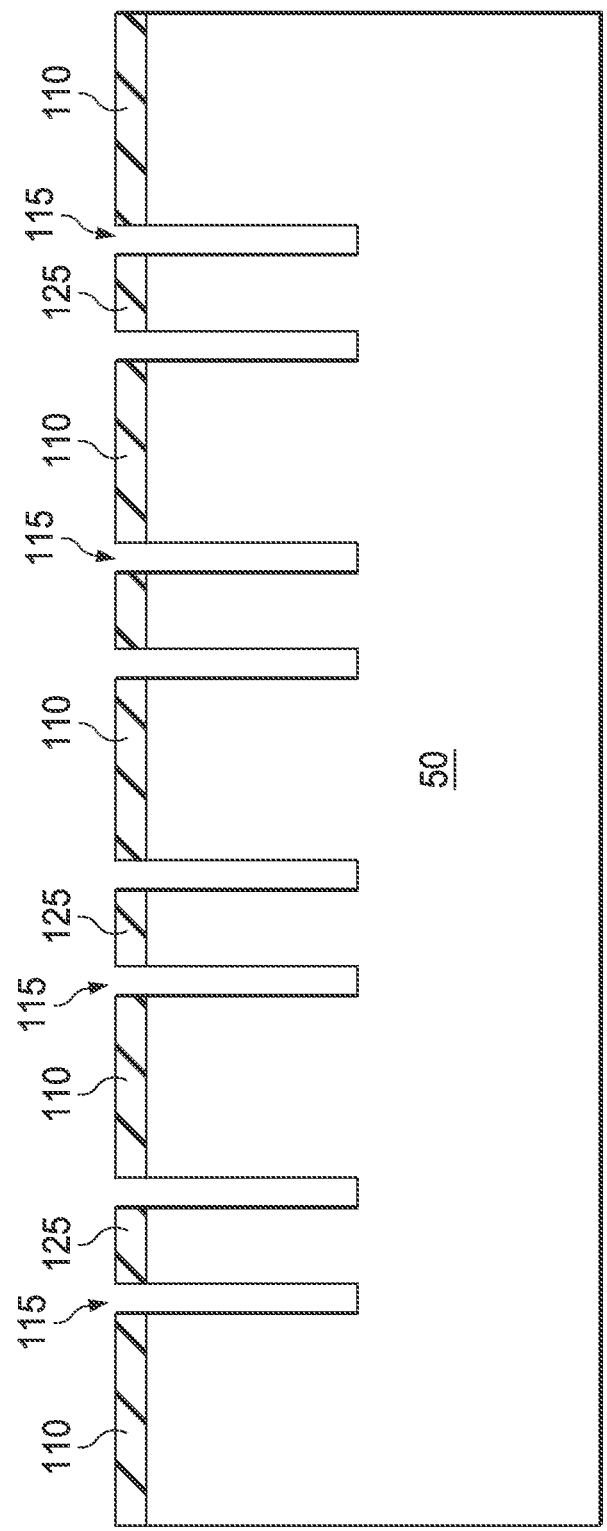

Referring to FIG. 6A, a plurality of narrow trenches 115 are formed in the substrate 50. The plurality of narrow trenches 115 include adjacent trenches separated by a mesa 125. In various embodiments, the plurality of narrow trenches 115 may be formed by forming a hard mask layer 110, patterning the hard mask layer 110, and etching the substrate 50 using the patterned hard mask layer 110 as described in the prior embodiment.

The plurality of narrow trenches 115 may have a depth of about 1 µm to about 10 µm in various embodiments. The plurality of narrow trenches 115 may have a depth of about 1 µm to about 5 µm in one or more embodiments. The plurality of narrow trenches 115 may have a depth of about 0.5 µm to about 1 µm in some embodiments.

Figure 6B:
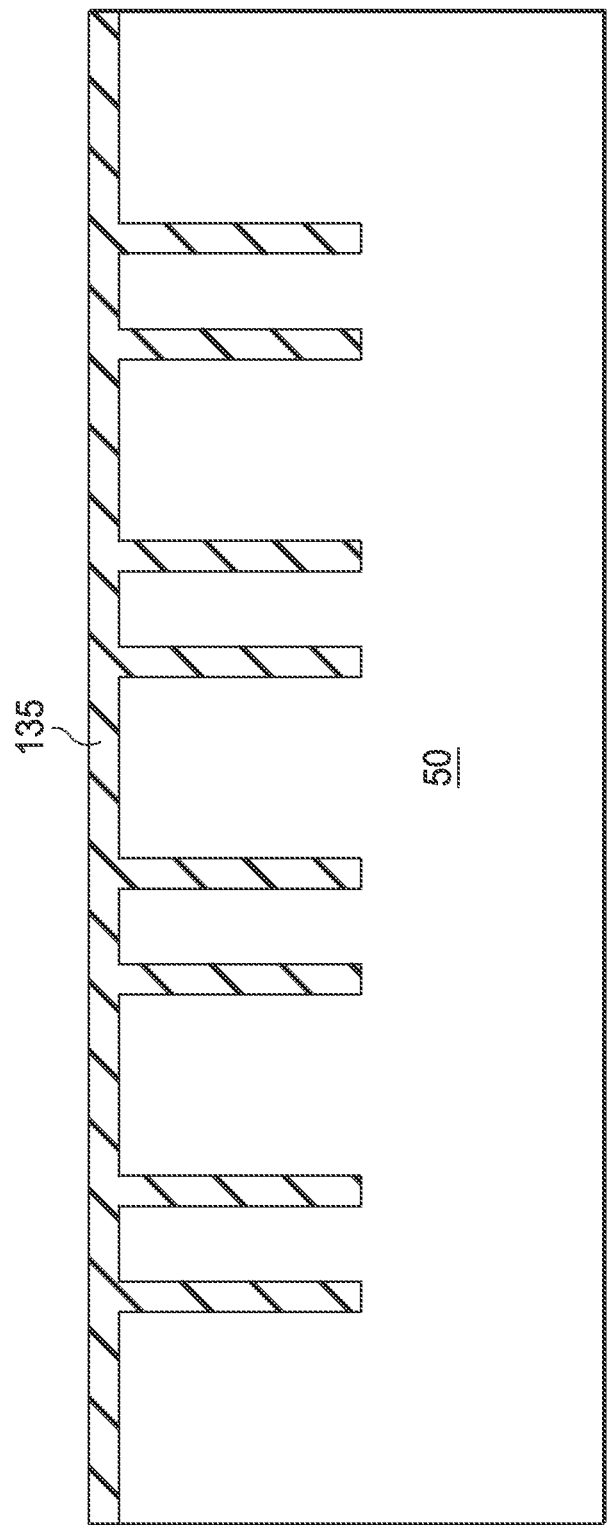

Referring to FIG. 6B, an insulating layer 135 is deposited over the substrate 50. The insulating layer 135 is formed to fill the plurality of narrow trenches 115. The insulating layer 135 may comprise a nitride material such as silicon nitride in one embodiment. In other embodiments, the insulating layer 135 may comprise a dielectric material, such as a hi-k dielectric material, having a different etch rate than silicon oxide. For example, the insulating layer 135 may comprise hafnium oxide in one embodiment.

Figure 6C:
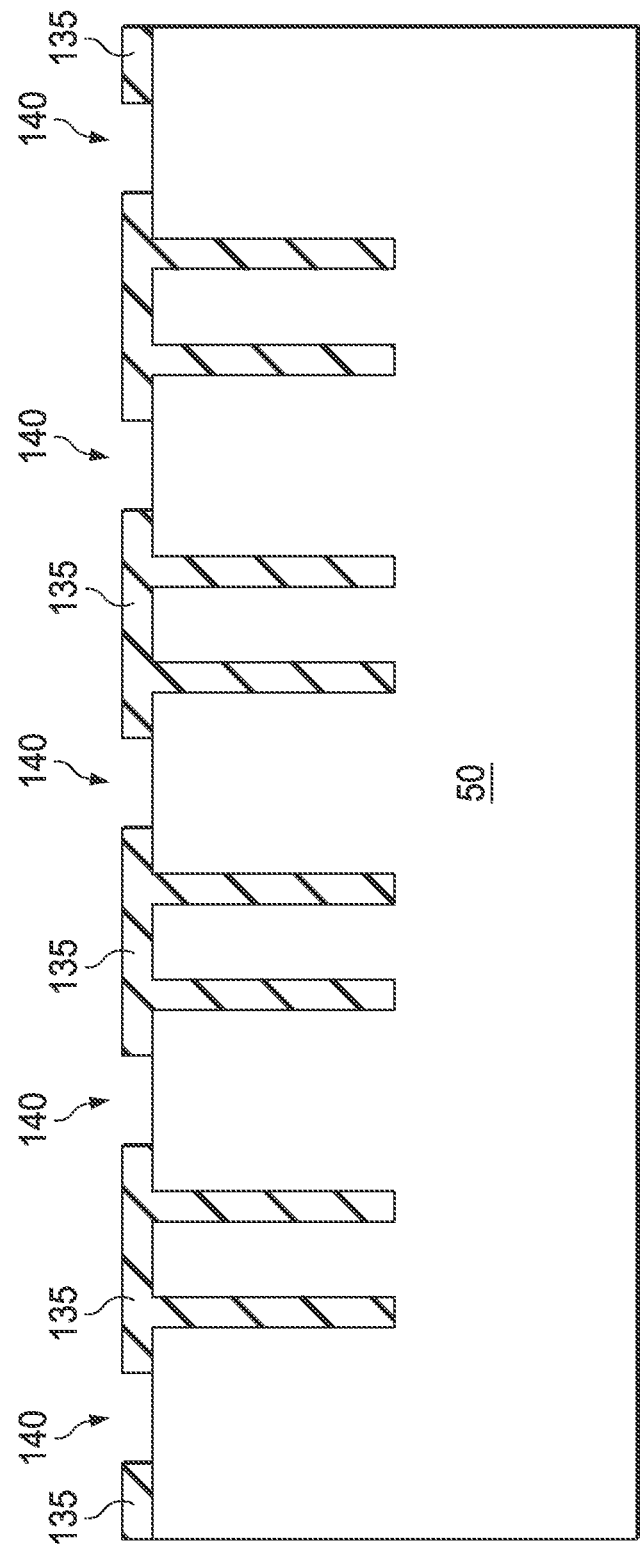
Figure 6D:
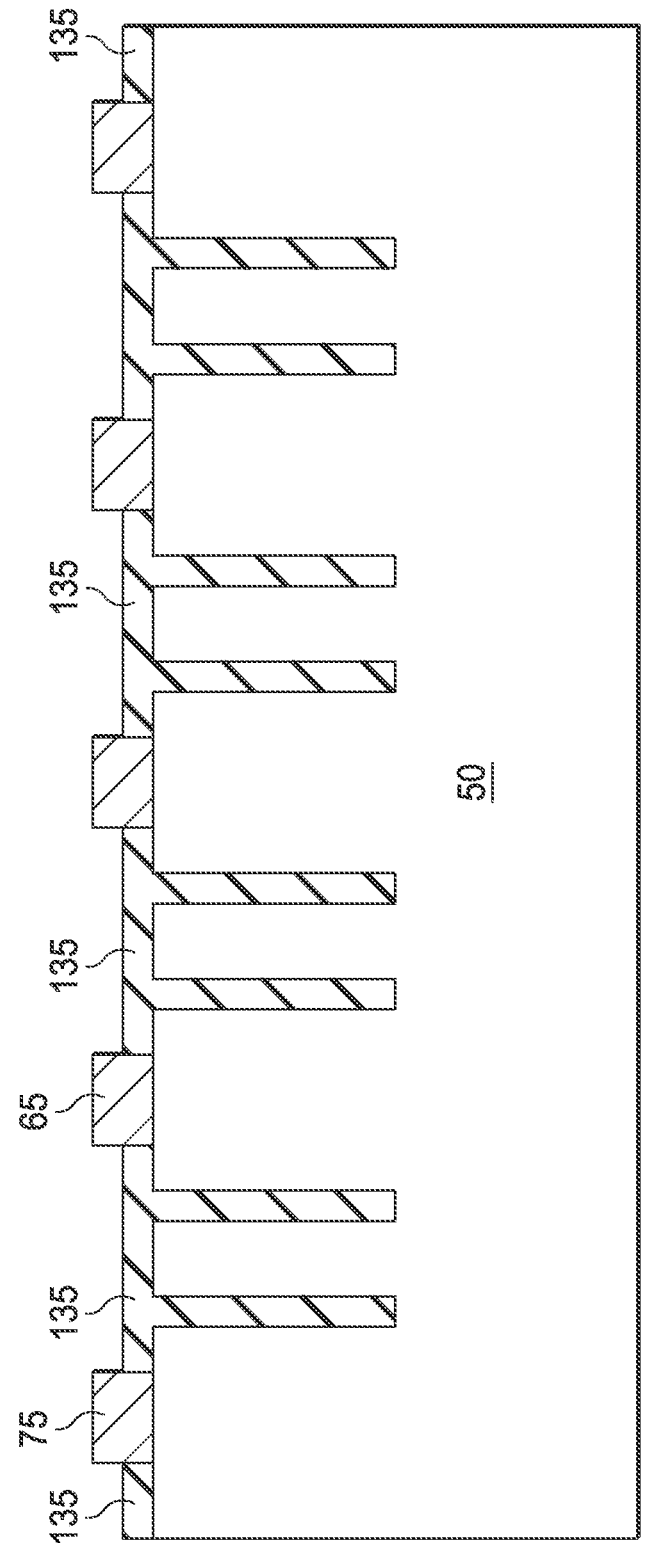

As next illustrated in FIG. 6C, the insulating layer 135 is patterned for metallization. In particular, the insulating layer 135 is patterned to form openings 140 for forming contacts. Referring next to FIG. 6D, a first contact pad 65 and a second contact pad 75 are formed within the openings 140.

Figure 6E:
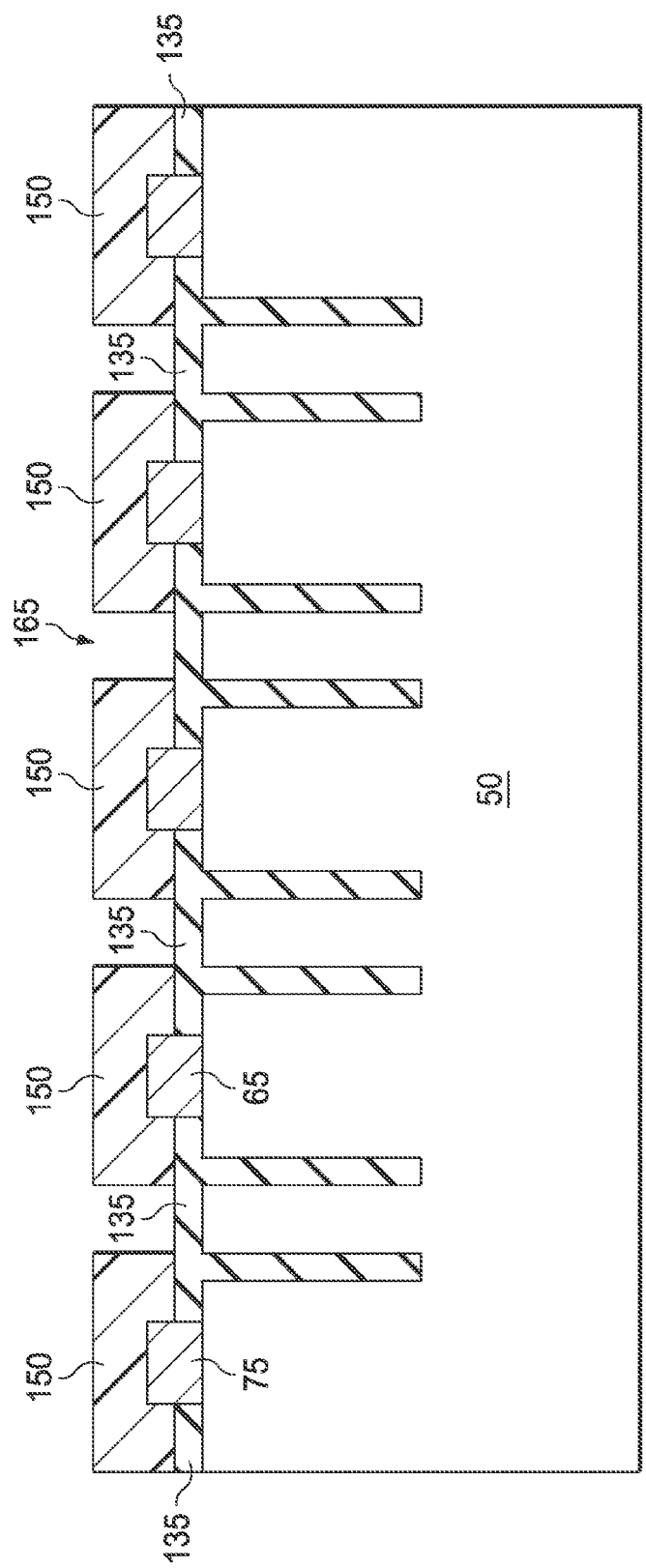
Figure 6F:
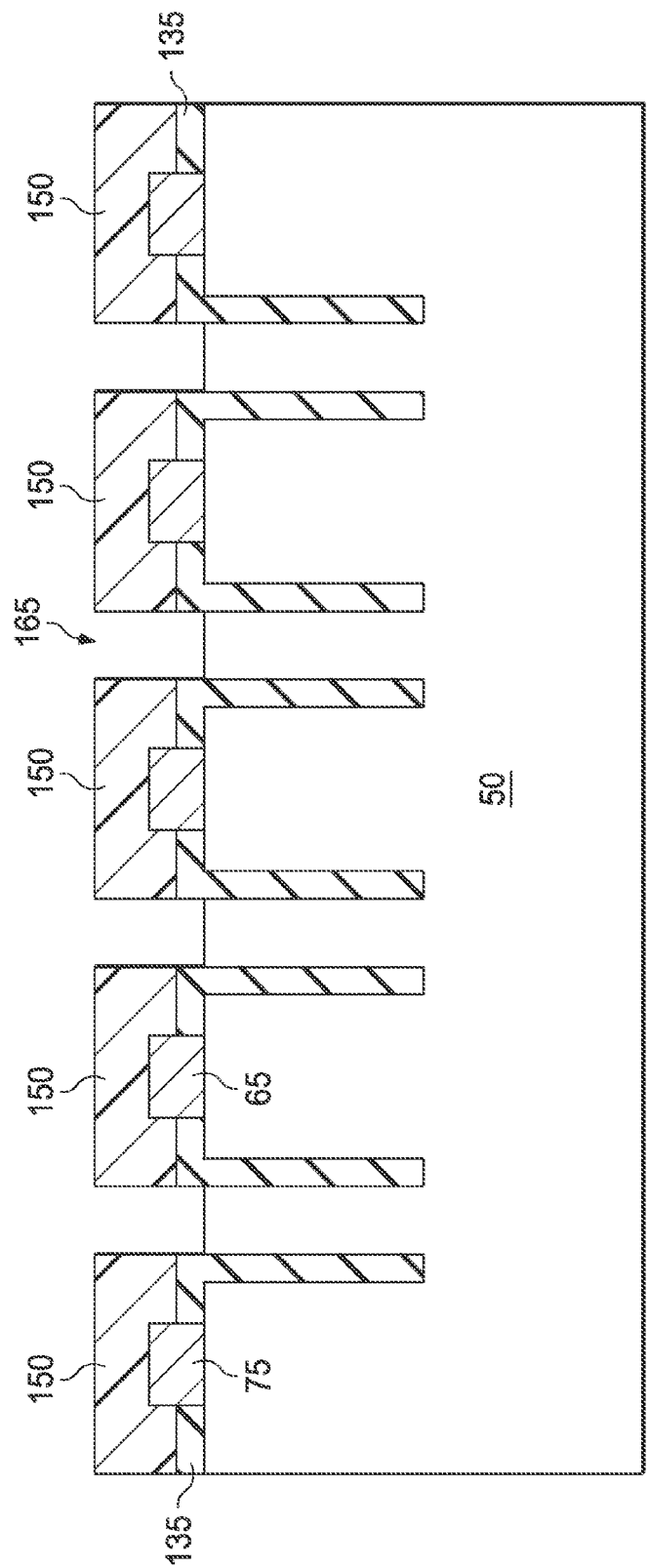

The mask layer 150 is deposited over the metallization as illustrated in FIG. 6E. The mask layer 150 is patterned, for example, using lithography forming trench openings 165. Referring to FIG. 6F, the exposed insulating layer 135 is etched, for example, using an anisotropic etch process such as reactive ion etching.

Figure 6G:
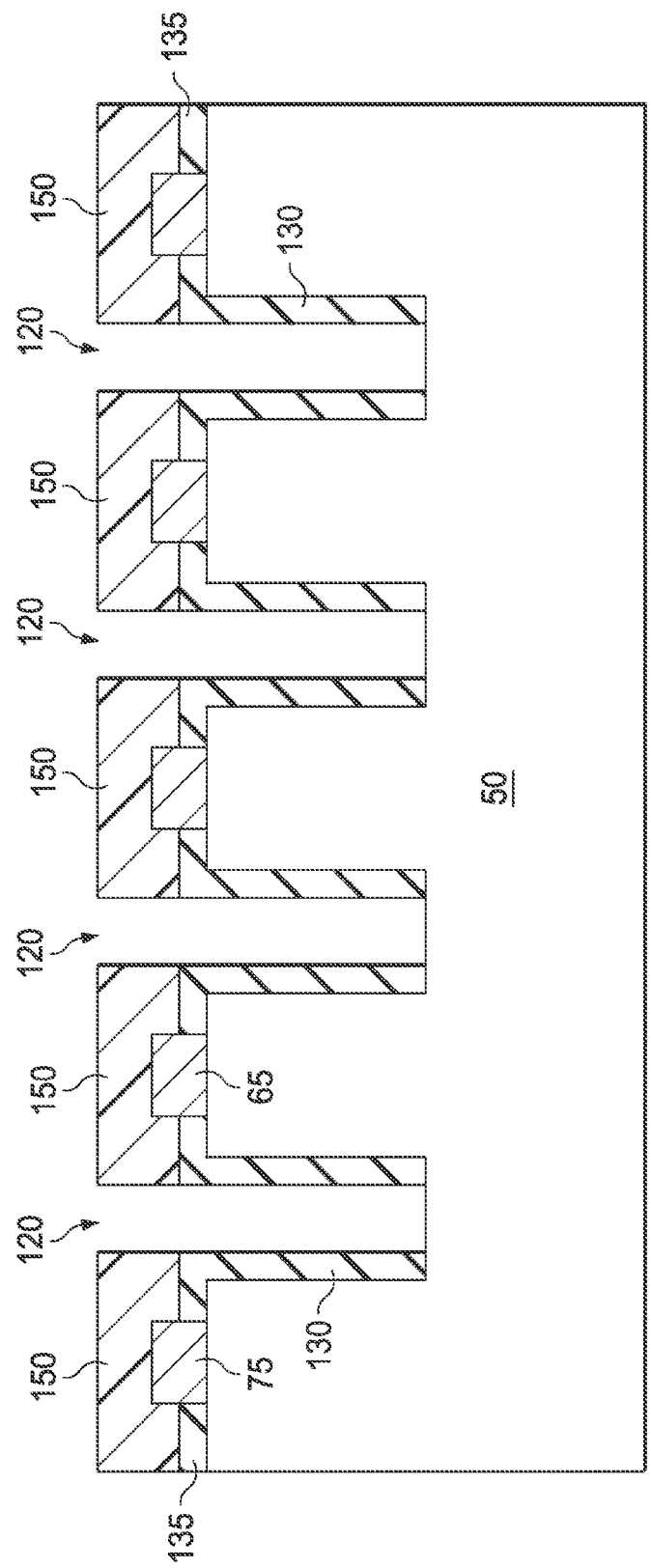
Figure 6H:
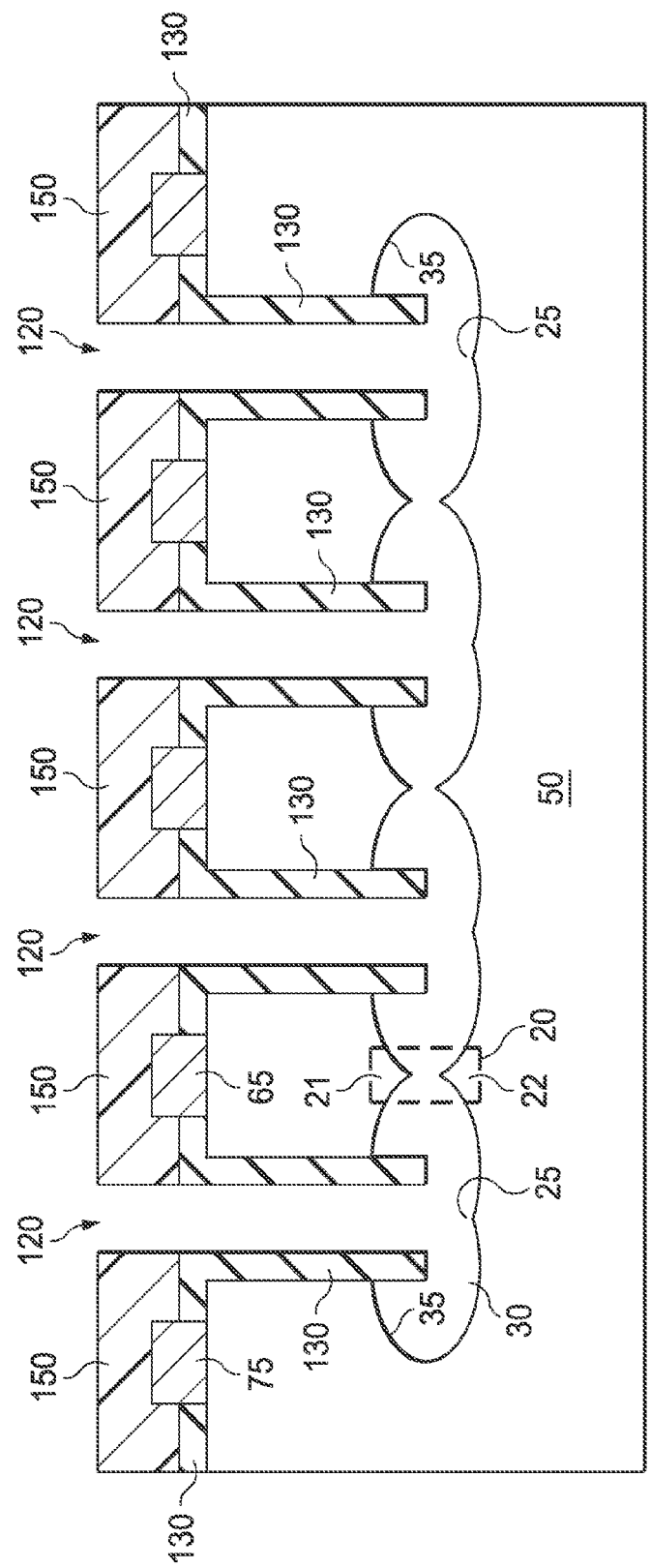
Figure 61:
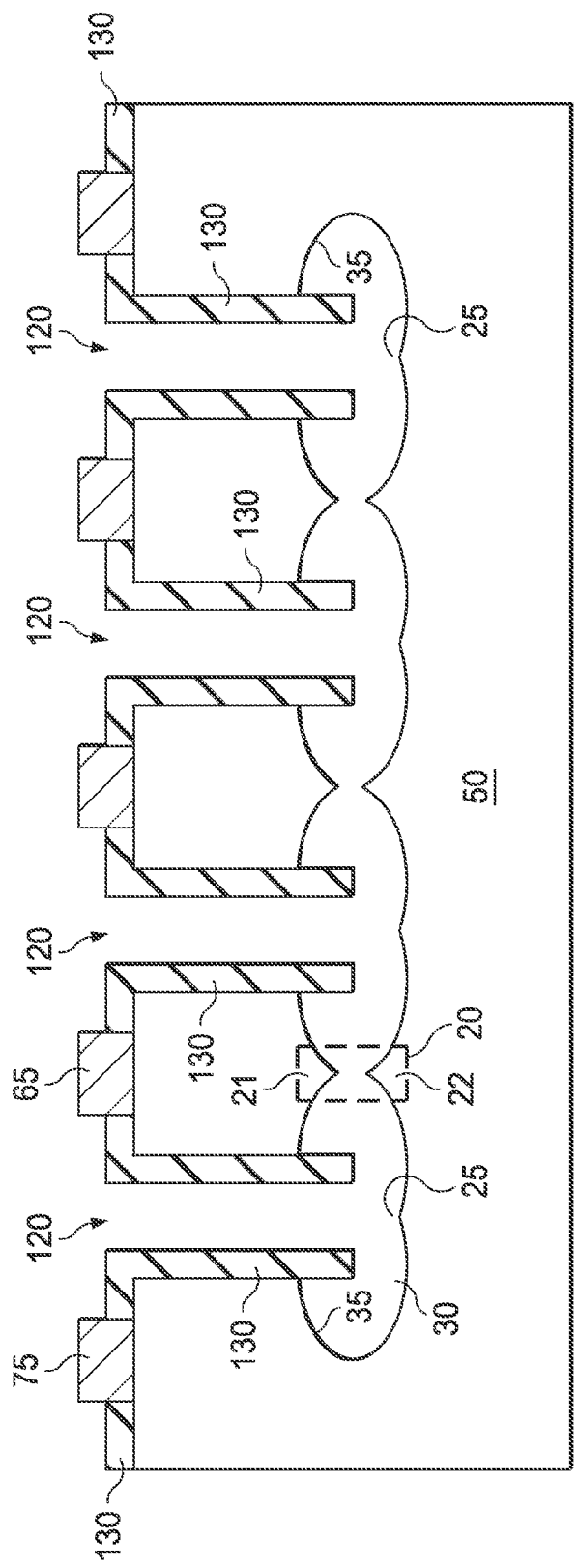

Referring to FIG. 6G, the plurality of trenches 120 is etched in the substrate 50 using the patterned mask layer 150. The etch process may be an anisotropic etch such as a reactive ion etch as described above in prior embodiments. An isotropic etching is performed as in prior embodiments to form the gap 30 (FIG. 6H). As described previously, the sidewalls 35 of the gap 30 between the adjacent trenches intersect in wedge-shaped edges 25, which form a plurality of field emission devices 20.

As illustrated in FIG. 6I, the mask layer 150 is removed, for example, by an etch process. As in prior embodiments, the substrate 50 may be optionally thinned from the back side and further processing may be performed as needed.

Figure 6J:
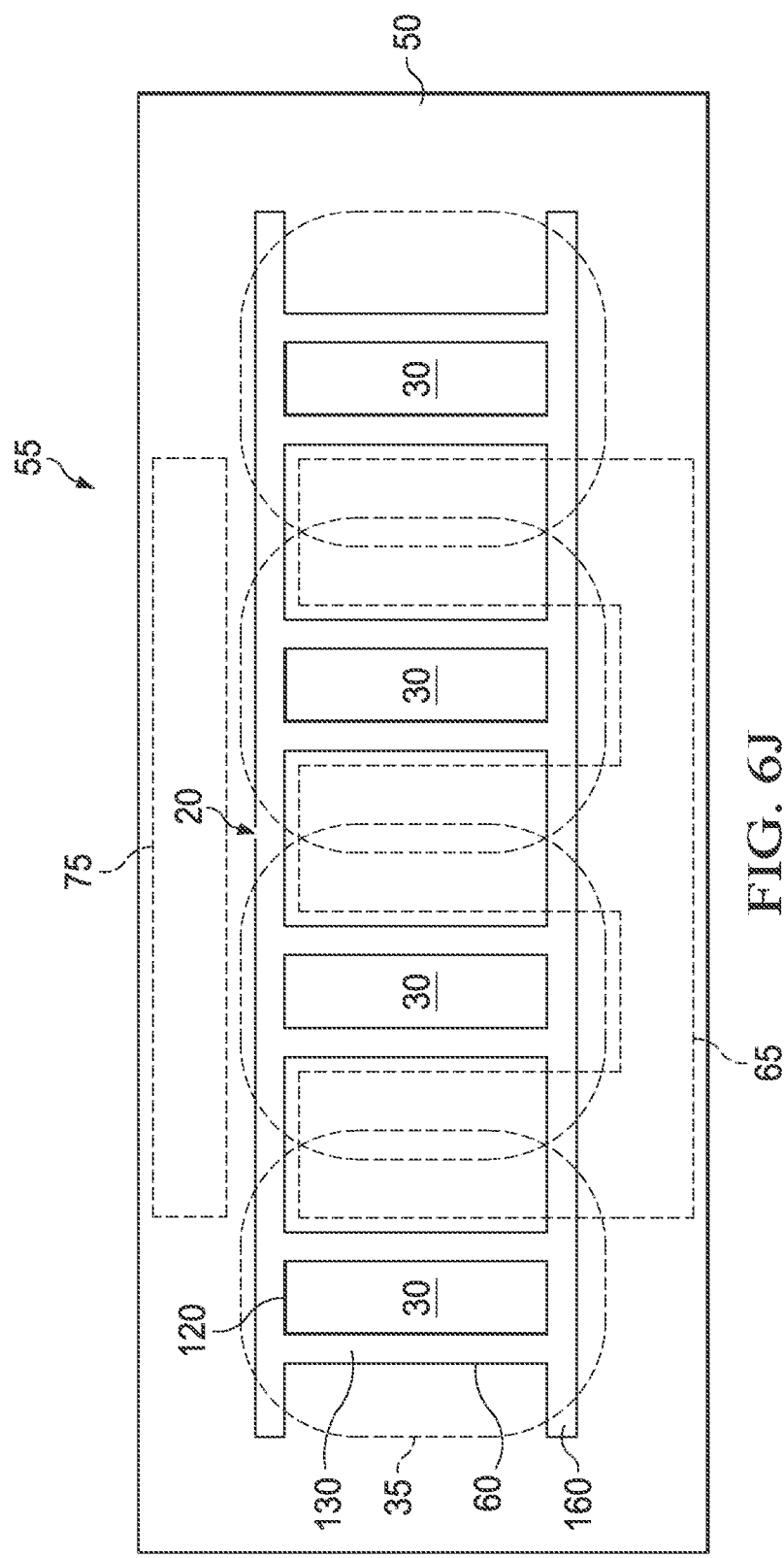

FIG. 6J illustrates a top view of the plurality of field emission devices at this stage of processing. As illustrated, each of the plurality of field emission devices 20 includes a wedge-shaped edge 25 formed between adjacent trenches of the plurality of trenches 120. The plurality of field emission devices 20 are isolated by the sidewall spacers 130 and the isolation trenches 160.

Similar to the prior embodiment, the first contact pad 65 may be formed as a single structure while the second contact pad 75 may be formed around the plurality of field emission devices 20.

Figure 7A:
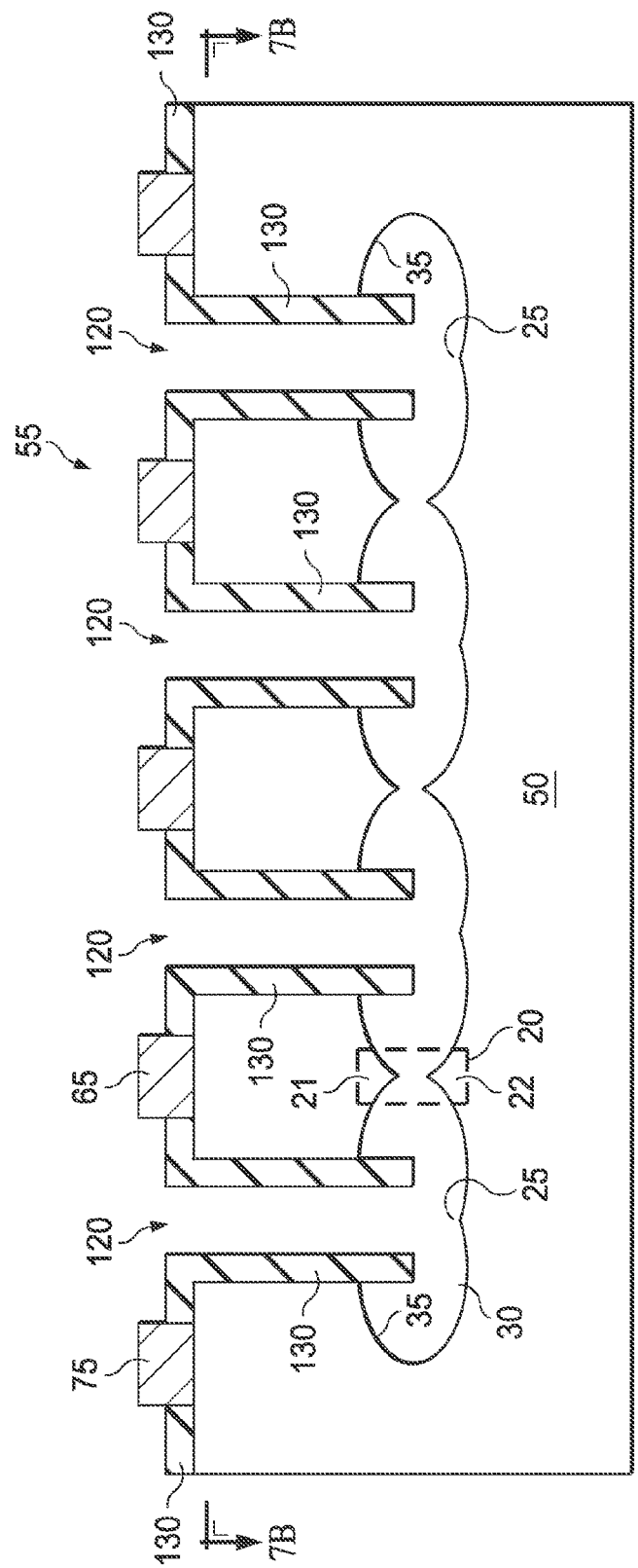
Figure 7B:
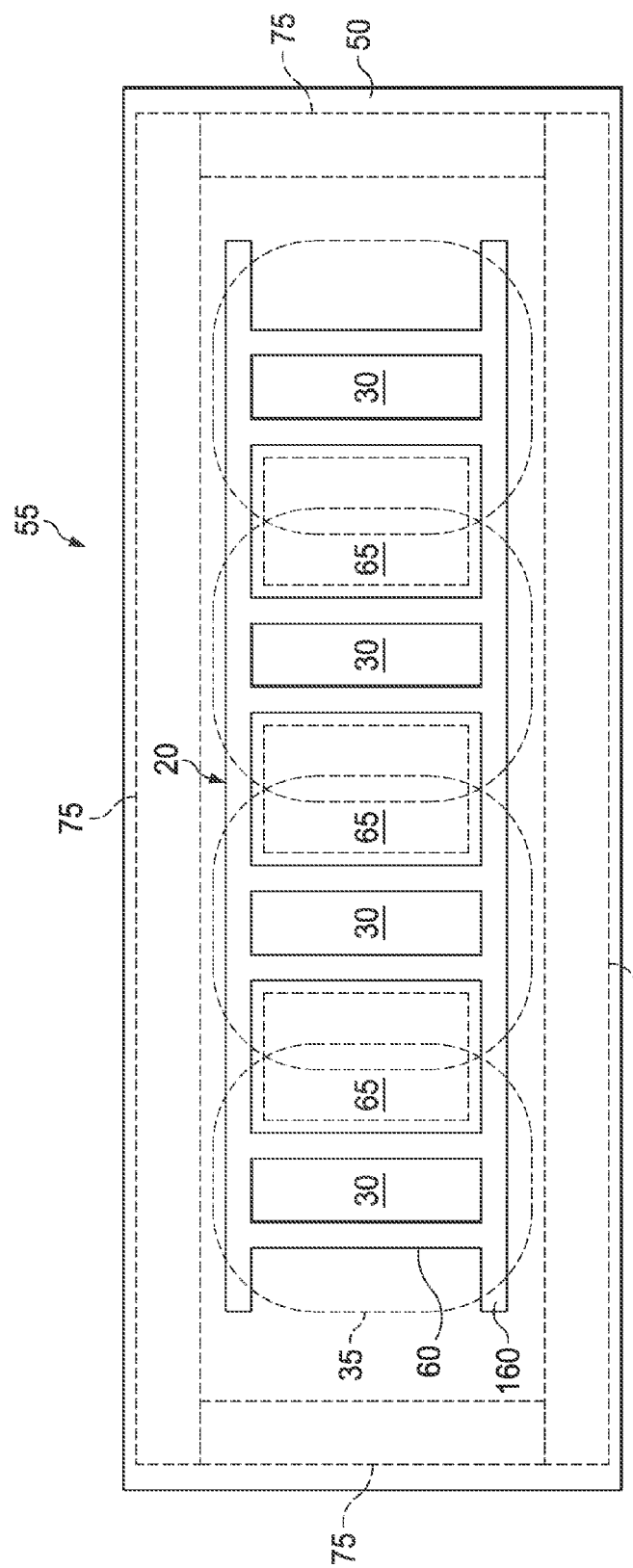

FIG. 7, which includes FIG. 7A-7C, illustrates a field emission device in accordance with an alternative embodiment of the present invention.

At this stage of processing described in FIGS. 5 and 6, the plurality of field emission devices 20 may be disposed in a semiconductor wafer. If so, the semiconductor wafer may be diced to form individual dies or chips, for example, a die 55 comprising a plurality of field emission devices 20.

In some embodiments, the structure illustrated in FIG. 4 or FIG. 5F may be processed further to form the die 55 illustrated in FIG. 7A and FIG. 7B. For example, the capping layer 90 may be removed using an etching process thereby exposing the plurality of trenches 120 and the gap 30. Alternatively, the structure illustrated in FIGS. 6I and 6K may be used to form the die 55.

Unlike the embodiments illustrated previously, in this embodiment, the first contact pad 65 may not be formed as a finger structure. Rather, the first contact pad 65 of the plurality of field emission devices 20 may be coupled through a conductive layer in the package.

Referring to FIG. 7C, the gap 30 and the plurality of trenches 120 may be hermetically sealed during the packaging process in various embodiments. In one or more embodiments, the die 55 is placed over a laminated board 250, which may be a printed circuit board. The die 55 is placed over the laminated board 250 in a flip chip configuration such that the first contact pad 65 and the second contact pad 75 face the laminated board 250. The first contact pad 65 and the second contact pad 75 on the die 55 may be attached to corresponding pads on the laminated board 250 using a solder material or a conductive paste in various embodiments. The separate first contact pad 65 of the plurality of field emission devices 20 may be coupled together through the laminated board and may have a first surface contact pad 260. Similarly, the second contact pad 75 may have a second surface contact pad 270 on the laminated board 250. An encapsulant 210 may be formed around the die 55 and over the laminated board 250 thereby sealing the gap 30 and the plurality of trenches 120.

FIG. 8, which includes FIGS. 8A-8G, illustrates a field emission device during various stages of fabrication in accordance with an alternative embodiment of the present invention.

Figure 8A:
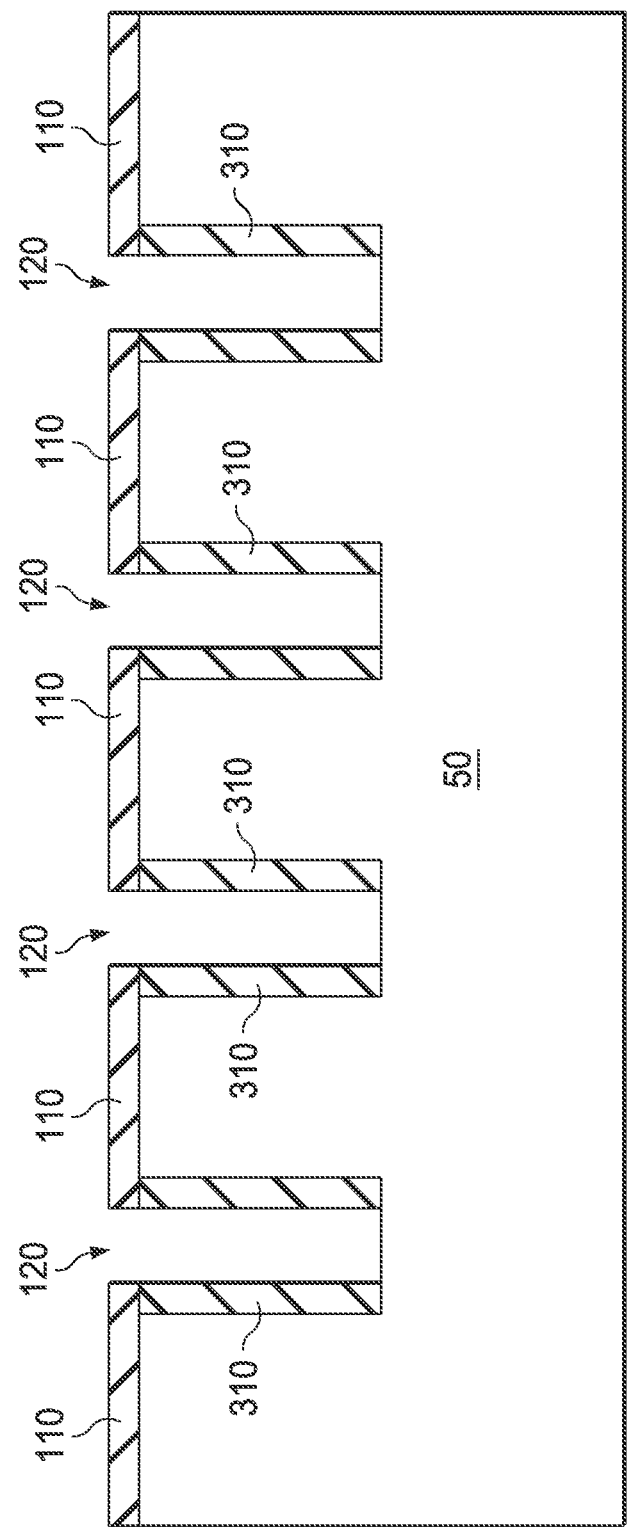

In this embodiment, an oxidation process is used to form the wedge-shaped edges of the plurality of field emission devices. Referring to FIG. 8A, a patterned hard mask layer 110 and a plurality of trenches 120 are formed as in prior embodiments. Next, an oxidation resistant liner 310 is deposited within the plurality of trenches 120. The oxidation resistant liner may comprise a nitride material such as silicon nitride in one embodiment. The oxidation resistant liner 310 may be deposited as a liner in various embodiments. The oxidation resistant liner 310 may be deposited using a vapor deposition process such as physical vapor deposition, chemical vapor deposition, plasma enhanced chemical vapor deposition, and other deposition processes. The oxidation resistant liner 310 is removed from the bottom surface of the plurality of trenches 120 using, for example, an anisotropic etch process so as to form sidewall spacers comprising the oxidation resistant liner 310.

Figure 8B:
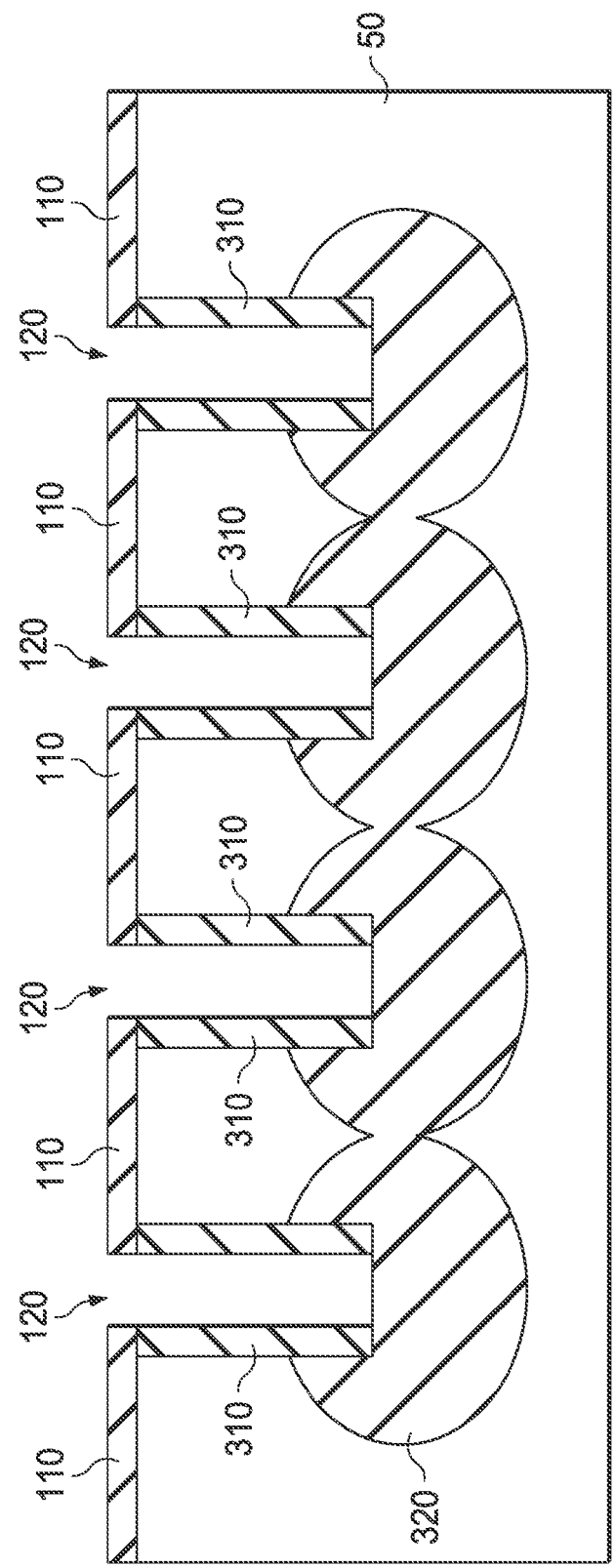

Referring next to FIG. 8B, the substrate 50 is exposed to an oxidation process. The region of the substrate 50 covered by the oxidation resistant liner 310 and the hard mask layer 110 remains protected from the oxidation process while the region of the substrate 50 exposed to the oxidation forms an embedded oxide layer 320. The oxidation process may be performed using our dry or wet oxidation process in various embodiments. The oxidation process may be performed at about 600° C. to about 900° C. in various embodiments.

Figure 8C:
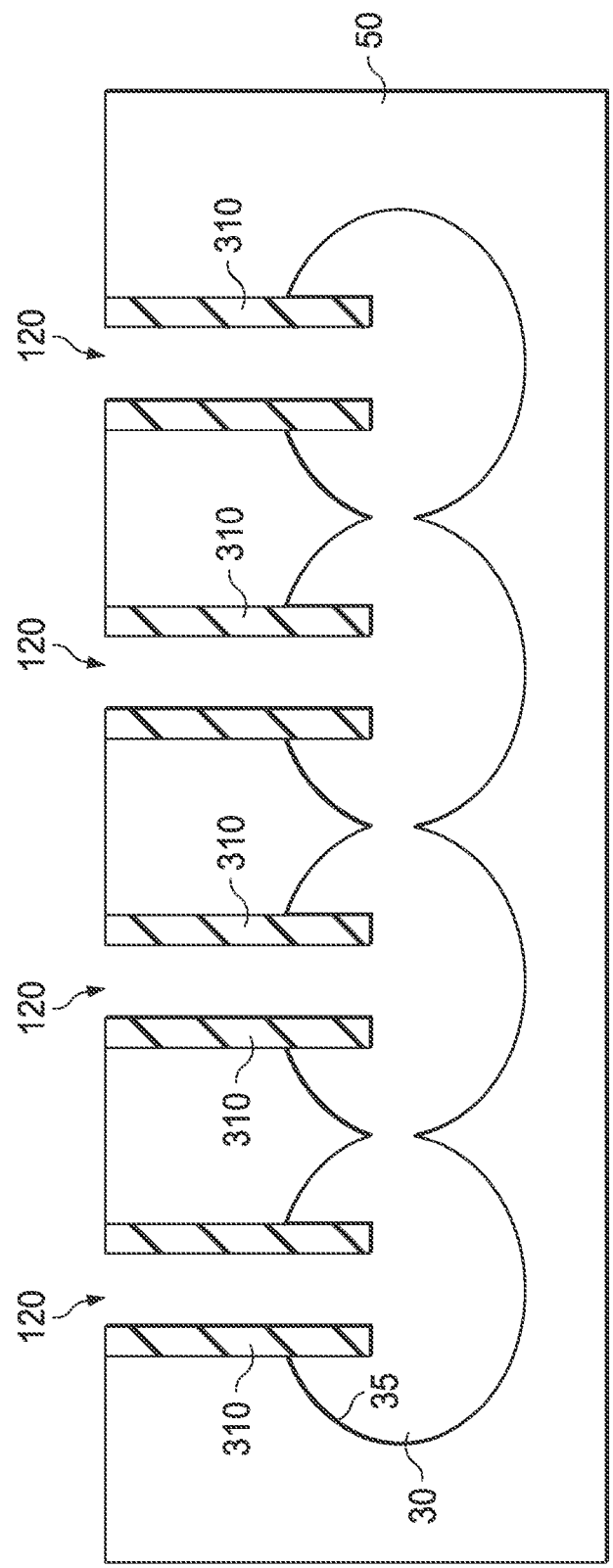

As next illustrated in FIG. 8C, the embedded oxide layer 320 is removed forming a gap 30. In various embodiments, the embedded oxide layer 320 may be removed using an isotropic wet etch process, which is selective to the embedded oxide layer 320. In one or more embodiments, the embedded oxide layer 320 may be etched using hydrofluoric acid, for example, a combination of hydrofluoric acid and water. Alternatively, in some embodiments, a buffered HF may be used to remove the embedded oxide layer 320.

Referring next to FIG. 8D, the plurality of trenches 120 and the gap 30 are sealed. In one embodiment, a capping layer 90 may be formed over the substrate 50 as described in prior embodiments. Alternatively, the exposed substrate 50 may be exposed to an epitaxial process so as to form an epitaxial capping layer 90, which because of the faceted nature of the growth processes seals the plurality of trenches.

Figure 8E:
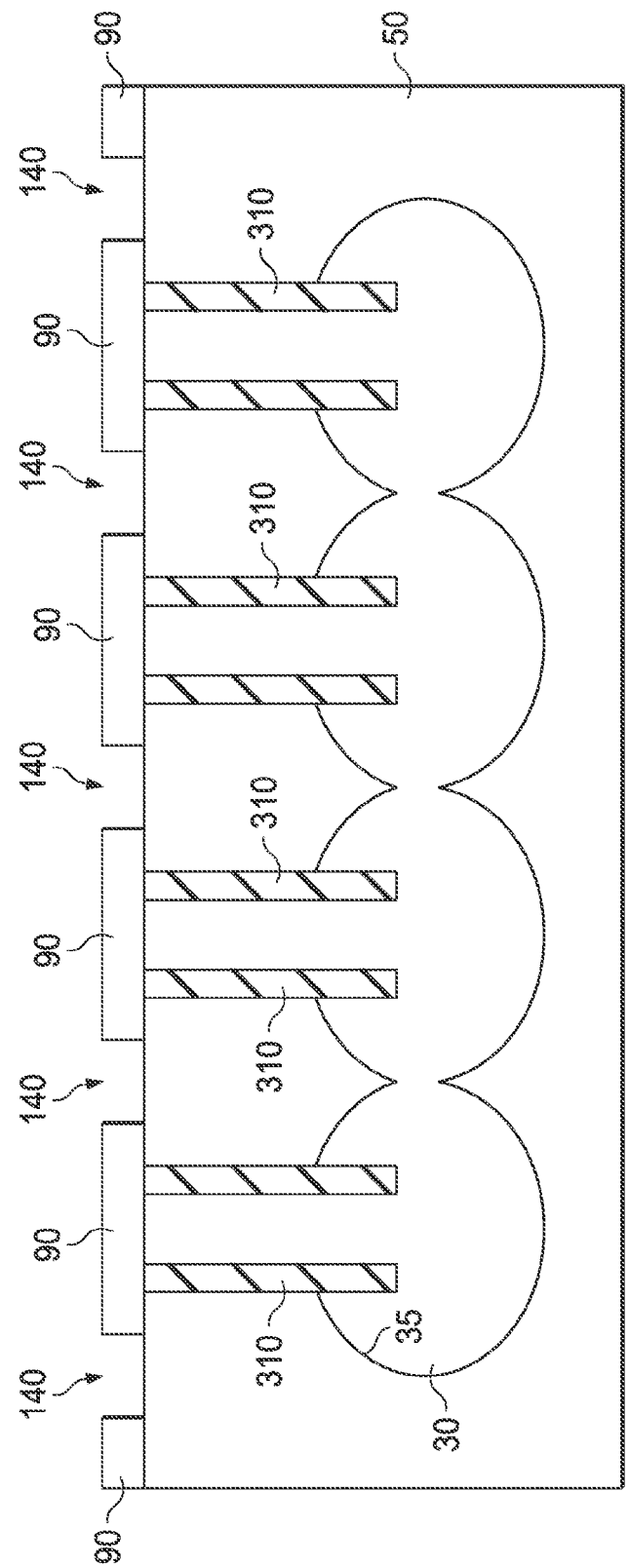

Referring to FIG. 8E, the capping layer 90 is patterned for contact openings 140 as described in prior embodiments.

Figure 8F:
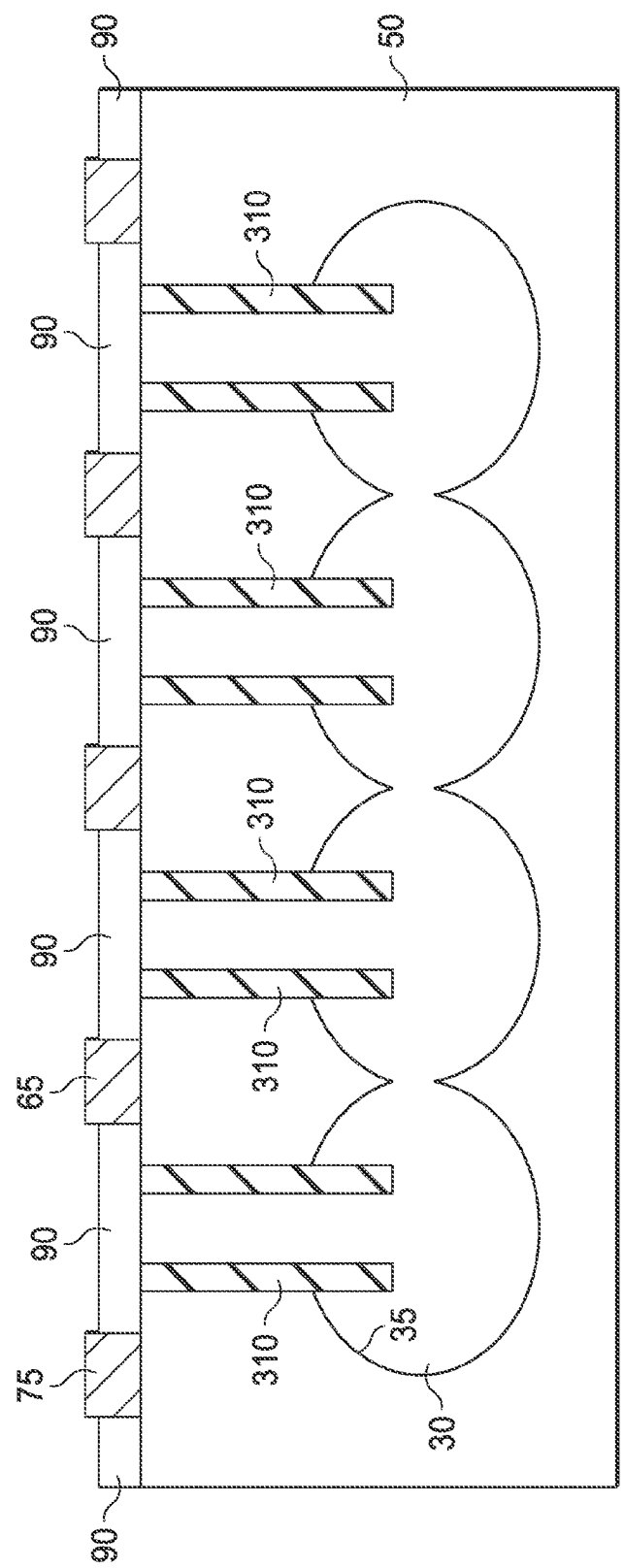

FIGS. 8F and 8G illustrate the field emission devices after forming a plurality of contacts, wherein FIG. 8F illustrates a cross-sectional view, and wherein FIG. 8G illustrates a top view. As illustrated in FIG. 8F, a plurality of contacts comprising the first contact pad 65 and the second contact pad 75 are formed within the openings 140 for contacts. FIG. 8G illustrates a top view of the field emission devices formed in FIG. 8F and shows the isolation trenches 160 as described earlier.

FIG. 9, which includes FIG. 9A-9E, illustrates a field emission device during various stages of fabrication in accordance with an alternative embodiment of the present invention.

Figure 9A:
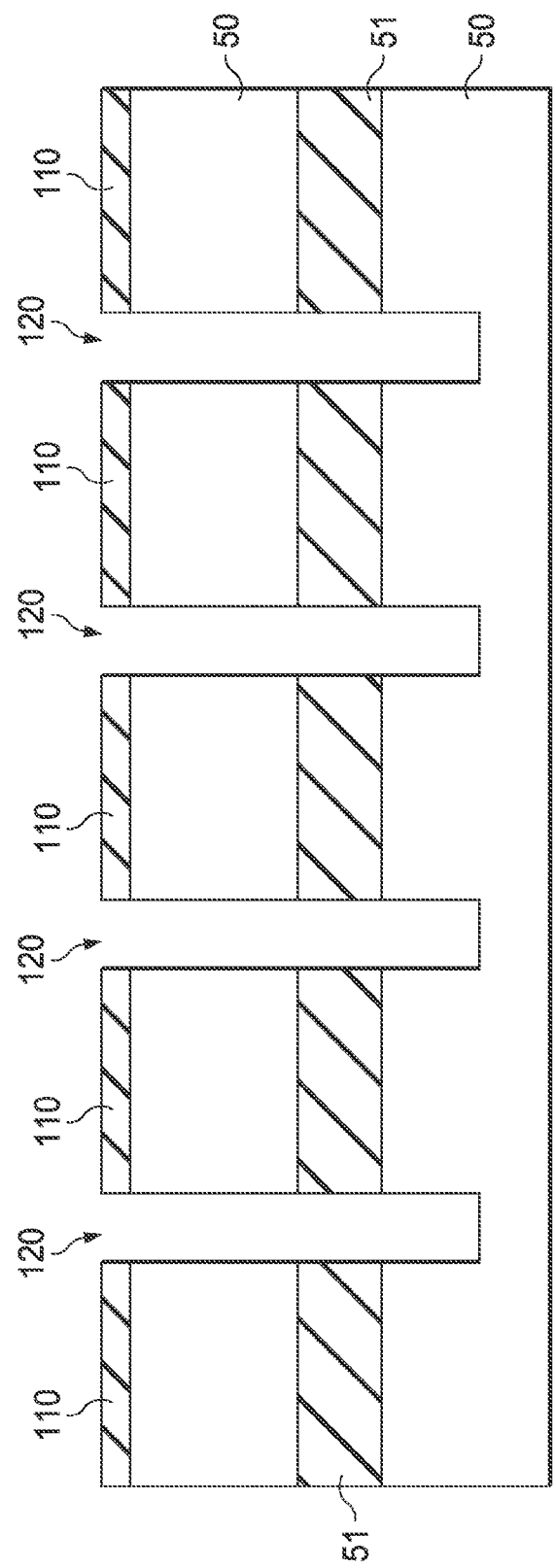
FIG. 9A-9E, illustrates a field emission device during various stages of fabrication in accordance with an alternative embodiment of the present invention.

While the prior embodiments had more flexibility in the type of substrate, this embodiment includes a substrate 50 comprising a semiconductor on insulator substrate. Therefore, as illustrated in FIG. 9A, the substrate 50 includes an insulator layer 51 disposed within.

Similar to the prior embodiments, a hard mask layer 110 is deposited and patterned. Using the patterned hard mask layer 110, a plurality of trenches 120 is formed in the substrate 50.

Figure 9B:
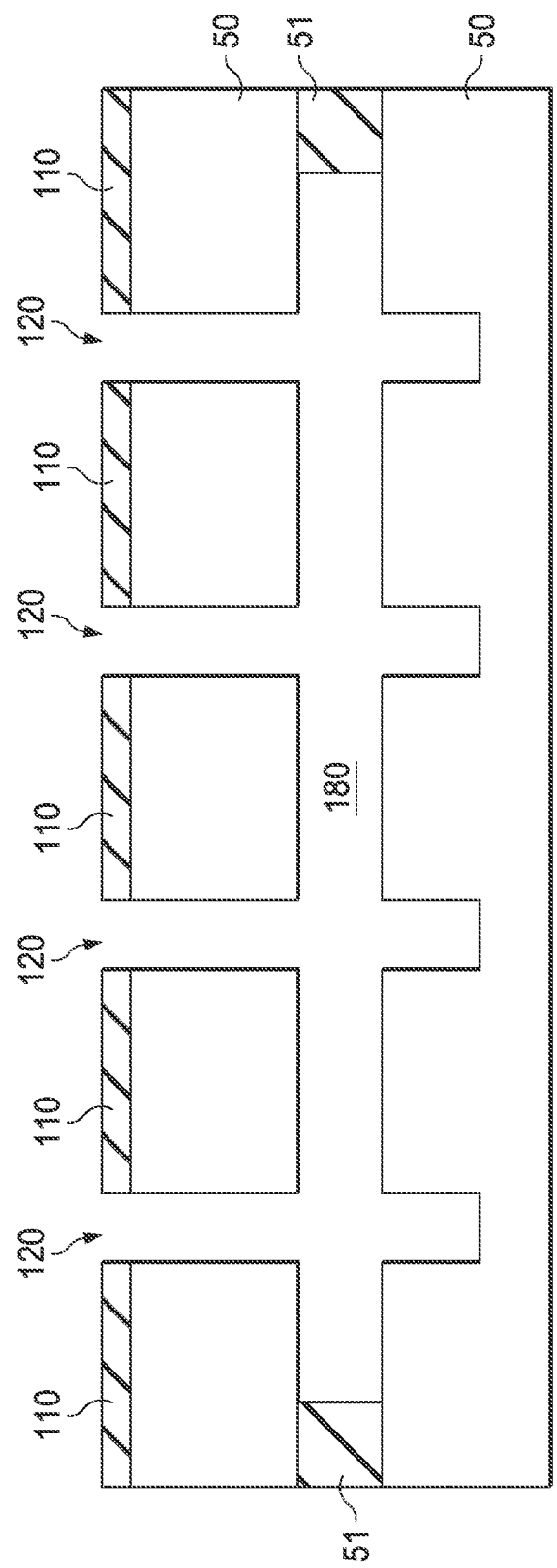

Referring next to FIG. 9B, a wet etch process is performed to form a cavity 180 disposed within the substrate 50. In various embodiments, the wet etch selectively removes the insulator layer 51. The etching time of the etch process may be set to control the amount of lateral etching.

Figure 9C:
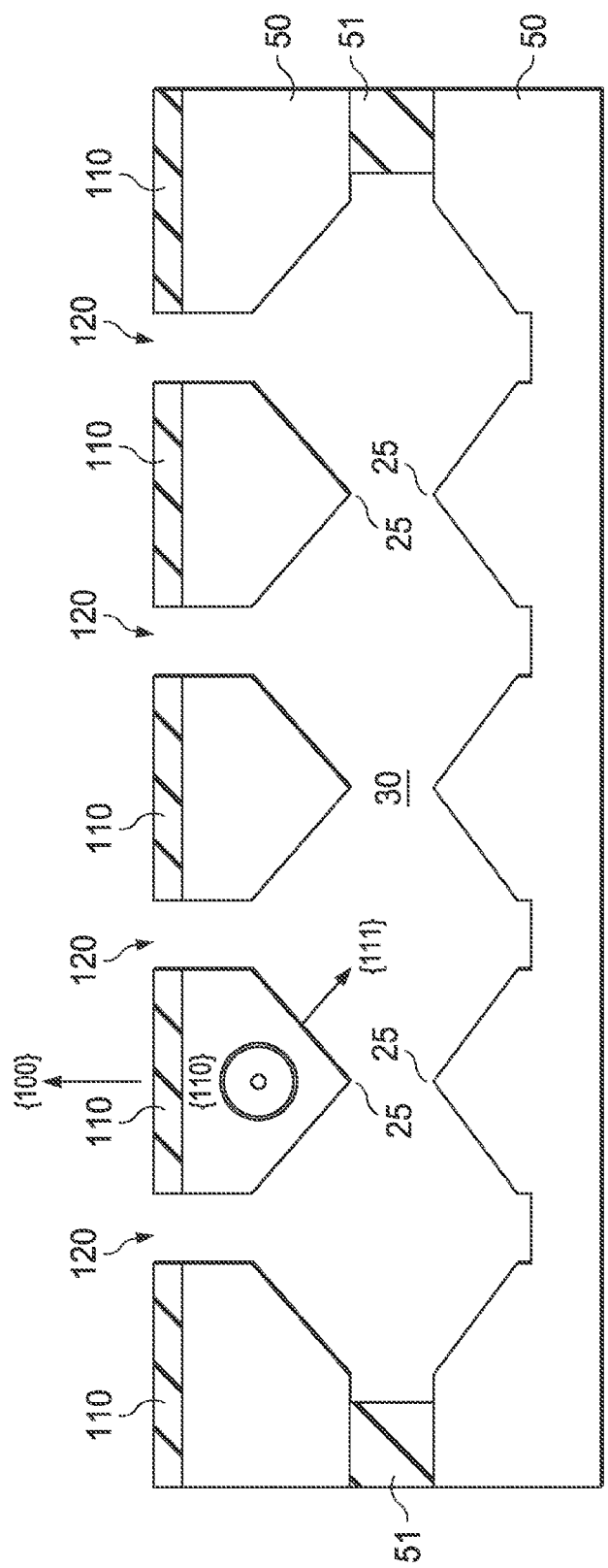

Referring to FIG. 9C, an anisotropic etch of the substrate is performed to form the gap 30. Unlike the prior embodiments, in this embodiment, an etchant is selected that etches faster along certain crystal orientations. For example, in one embodiment, an etchant is selected, which etches faster along {100} plane than along {110} plane than along {111} planes. As a consequence, the etching process exposes {111} planes, which are the planes with the slowest etching rates. In various embodiments, the anisotropic crystallographic etching may be performed using hydroxides such as KOH, NaOH, CeOH, RbOH, $NH_4OH$, and tetra-methyl ammonium hydroxide (TMAH, which is $(CH_3)_4NOH$).

In one embodiment, a capping layer may be formed as described in prior embodiments to sealed the gap 30, and patterned to form contacts.

Figure 9D:
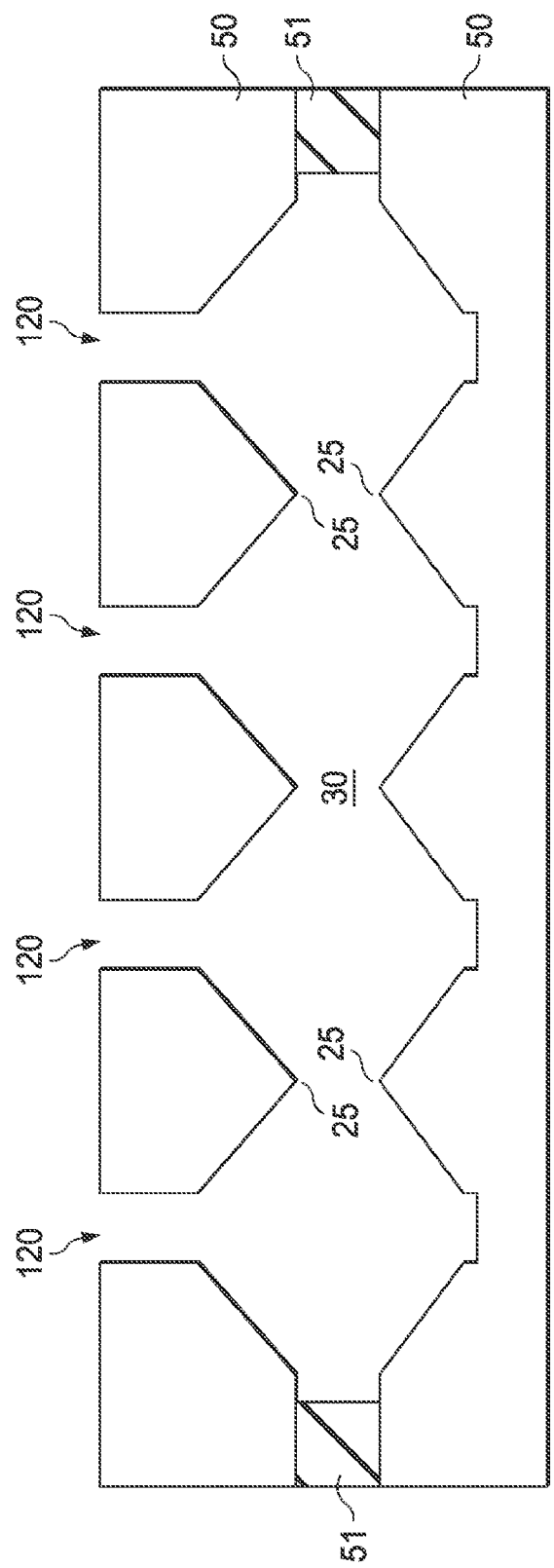
Figure 9E:
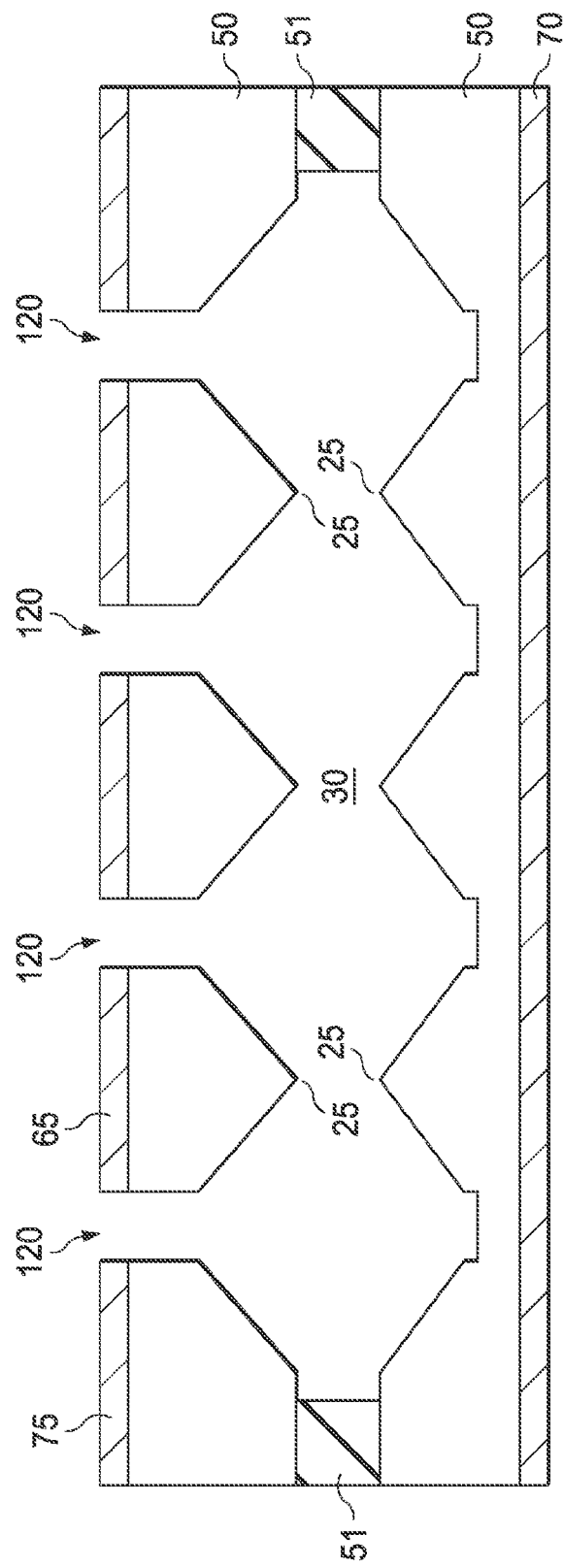

Alternatively, as illustrated in FIG. 9D, the contacts may be directly formed over the substrate 50 without further patterning. In one or more embodiments, any remaining hard mask layer 110 may be removed.

As next illustrated in 9E, front and back side metallization layers may be formed on the front and back surfaces of the substrate 50. The front and back side metallization layers may comprise a back side conductive layer 70, a first contact pad 65, and a second contact pad 75. The front and back side metallization layers may be deposited directly in one or more embodiments over the surface of the substrate 50. Alternatively, the barrier layers may be introduced between the metallization layers of the substrate 50. The front and back side metallization layers may comprise aluminum, copper, tungsten, and/or titanium in one embodiment. The front and back side metallization layers may comprise a silicide material such as nickel, titanium, cobalt, tungsten, tantalum, platinum, silver, and others in one or more embodiments. The front and back side metallization layers may comprise metal nitrides in one or more embodiments.

Figure 10A:
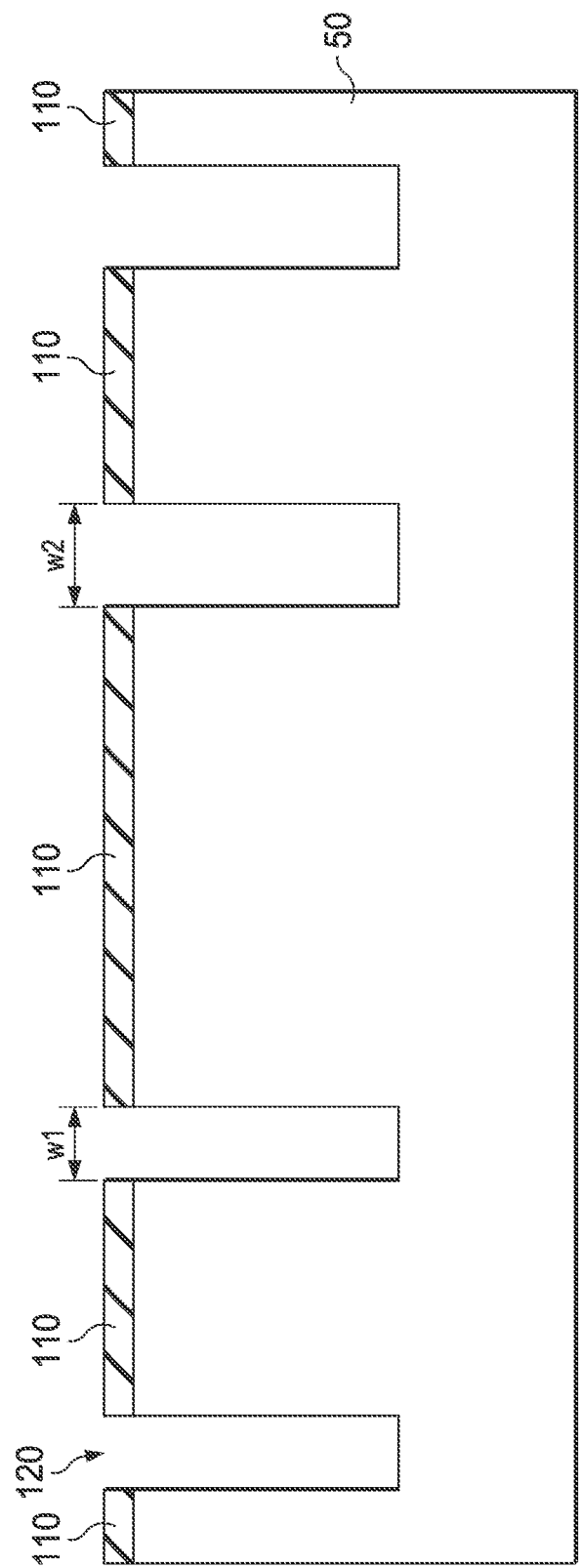
FIGS. 10A and 10B, illustrates a field emission device during various stages of fabrication in accordance with an alternative embodiment of the invention.
Figure 10B:
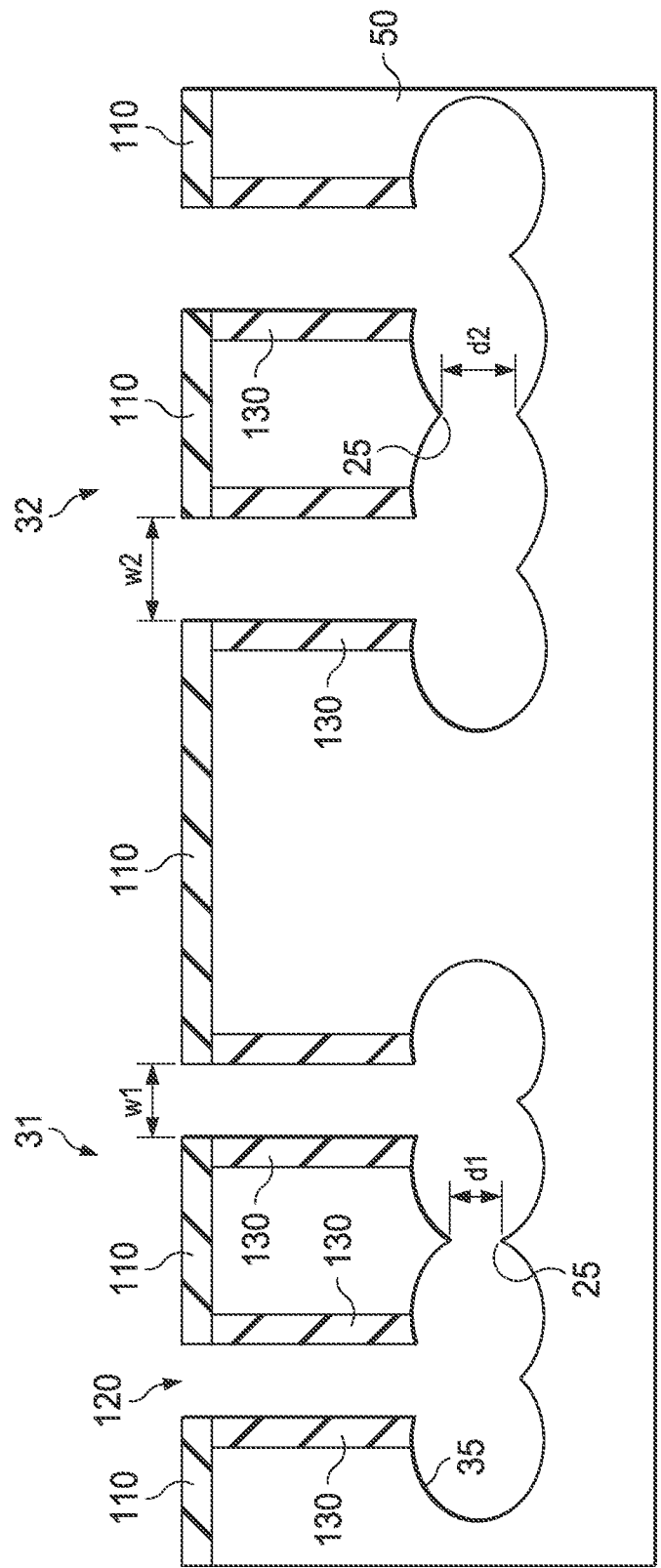

FIG. 10, which includes FIGS. 10A and 10B, illustrates a field emission device during various stages of fabrication in accordance with an alternative embodiment of the invention.

Referring to FIG. 10A, a plurality of trenches 120 are formed as described in prior embodiments. However, the plurality of trenches 120 have a first set of trenches at a first critical dimension W1 and a second set of trenches at a second critical dimension W2. Next, the processes described in FIGS. 5B-5C are performed forming the plurality of field emission devices 20. Subsequent processing may continue as described earlier, e.g., in FIGS. 5B-5K.

As next illustrated in FIG. 10B, because of the differences in the width of the trenches between the first and the second set of trenches of the plurality of trenches 120, a first set of field emission devices 31 different from the second set of field emission devices 32 are formed. The first set of field emission devices 31 may have a first distance d1 between the wedge-shaped edges 25 while the second set of field emission devices 32 may have a second distance d2 between the wedge-shaped edges 25. The second distance d2 may be larger than the first distance d1 because of the differences in the etching rate of the anisotropic etch forming the gap 30.

Figure 11:
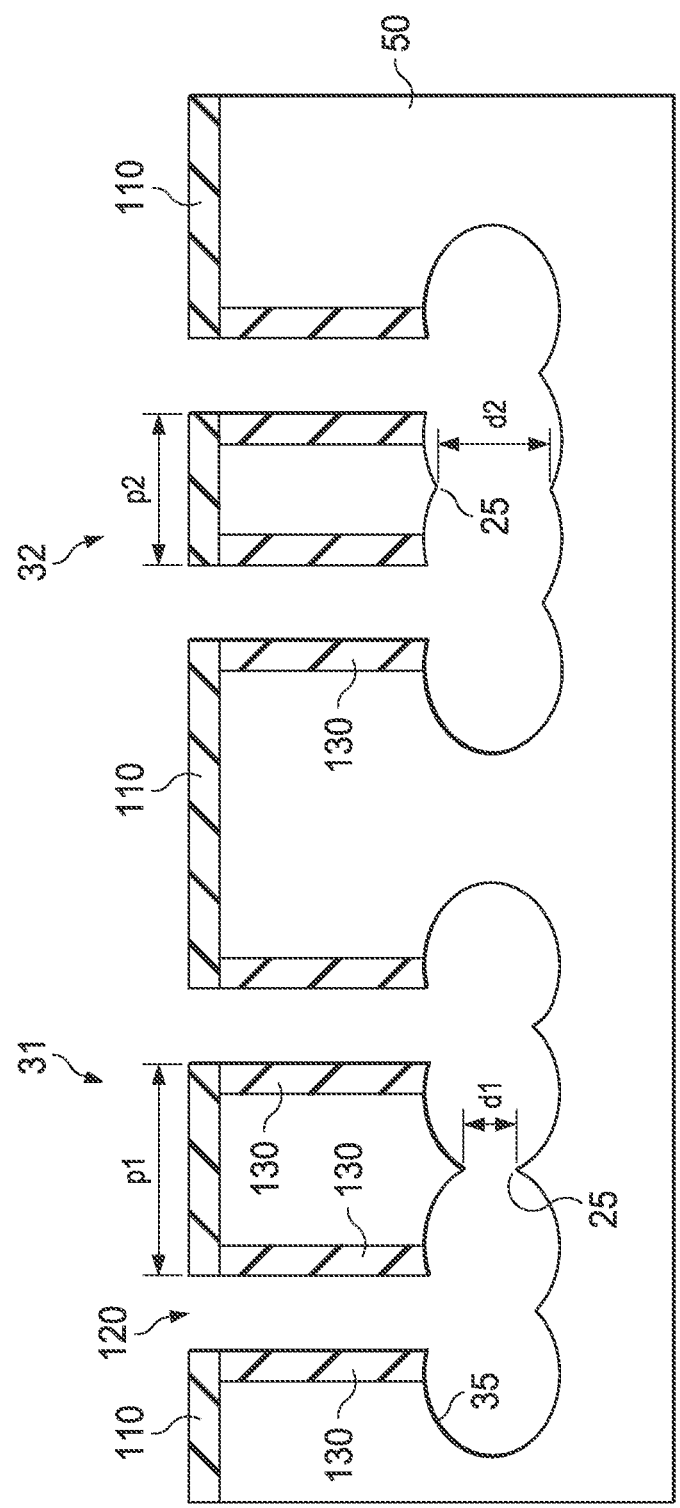
FIG. 11 illustrates a field emission device during fabrication in accordance with an alternative embodiment of the invention.

FIG. 11 illustrates a field emission device during fabrication in accordance with an alternative embodiment of the invention.

Similarly, in another embodiment, the first and the second set of field emission devices 31 and 32 may be formed by changing the distance between the trenches. As illustrated, the first pitch p1 is larger than the second pitch p2, which results in the first set of field emission devices 31 having a first distance d1 smaller than the second distance d2 of the second set of field emission devices 32.

Thus, embodiments described above with respect to FIGS. 10 and 11 enable changing the gap distance of the field emission devices without adding additional patterning steps.

FIG. 12, which includes FIGS. 12A-12D, illustrates a field emission device during fabrication in accordance with an alternative embodiment of the invention.

This embodiment follows the process steps illustrated in FIG. 5. But unlike FIG. 5, in this embodiment, the dimensions of the features are different.

FIG. 12A-1 illustrates a top view and FIG. 12A-2 illustrates a cross-sectional view of a field emission device array after forming a plurality of trenches 120. As illustrated in FIG. 5A, the hard mask layer 110 is deposited and patterned to form pillars 145.

Figure 12B:
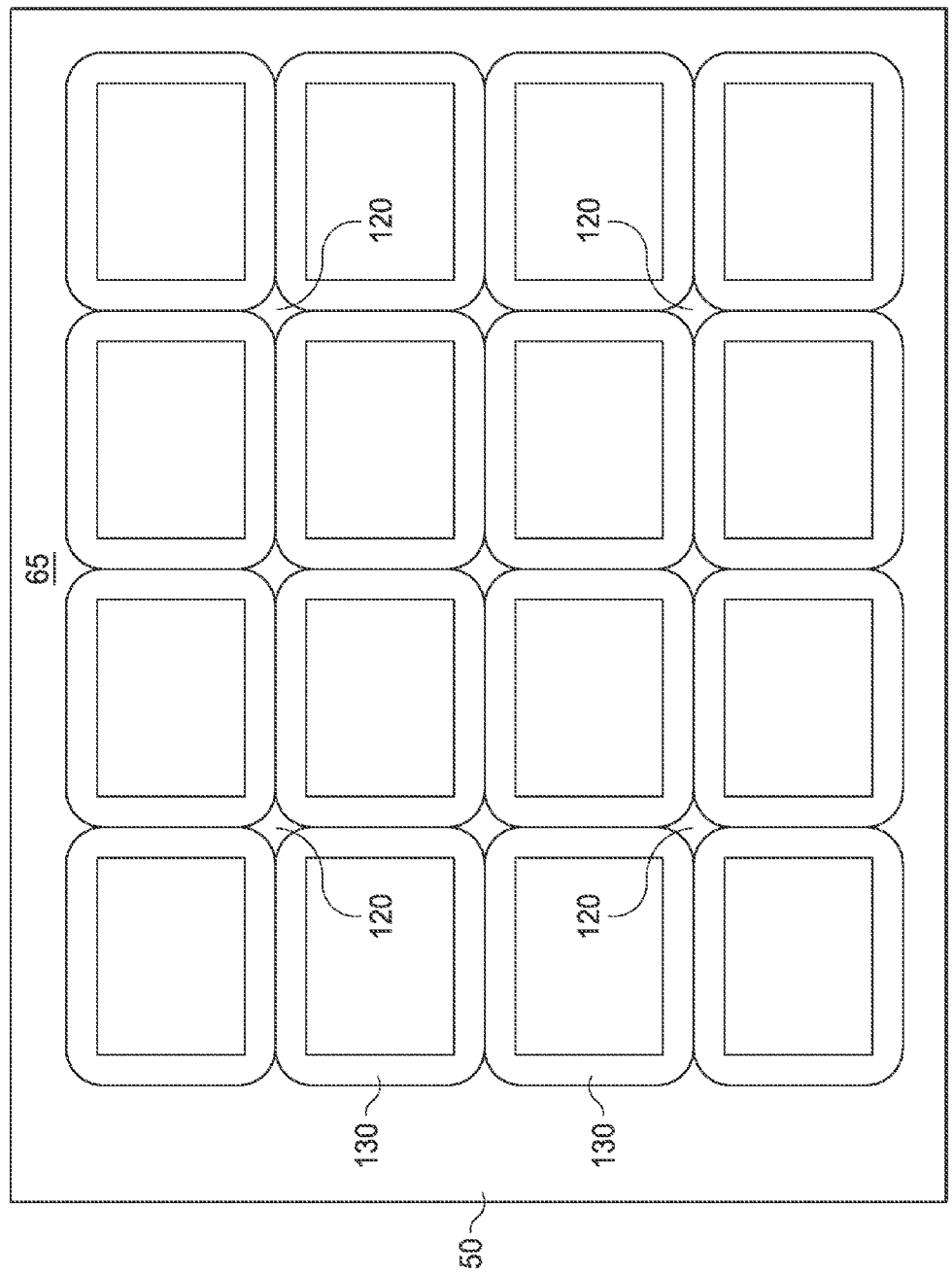

Sidewalls spacers are formed along the sidewalls of the plurality of trenches 120 as illustrated in FIG. 12B.

Figures 2, 12C:
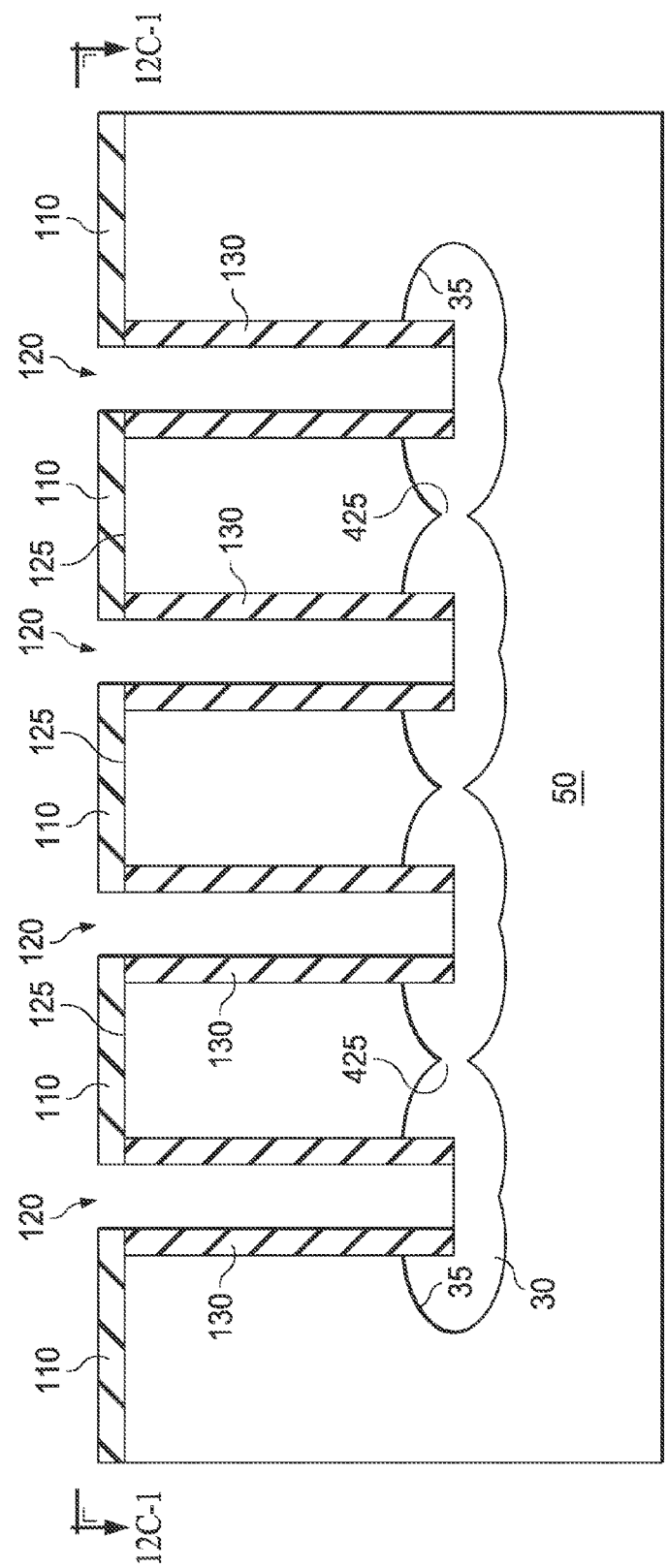

Referring to FIG. 12C-1, which is a top view, and FIG. 12C-2, which is a cross-sectional view, anisotropic etching is performed to form the gap 30 and the tips 425. Unlike the prior embodiments, the isotropic etch proceeds equally from four corners of the pillars 145 (illustrated as arrows in FIG. 12C-2) so that a zero dimensional tip is formed instead of an one-dimensional edge as in prior embodiments.

Figure 12D:
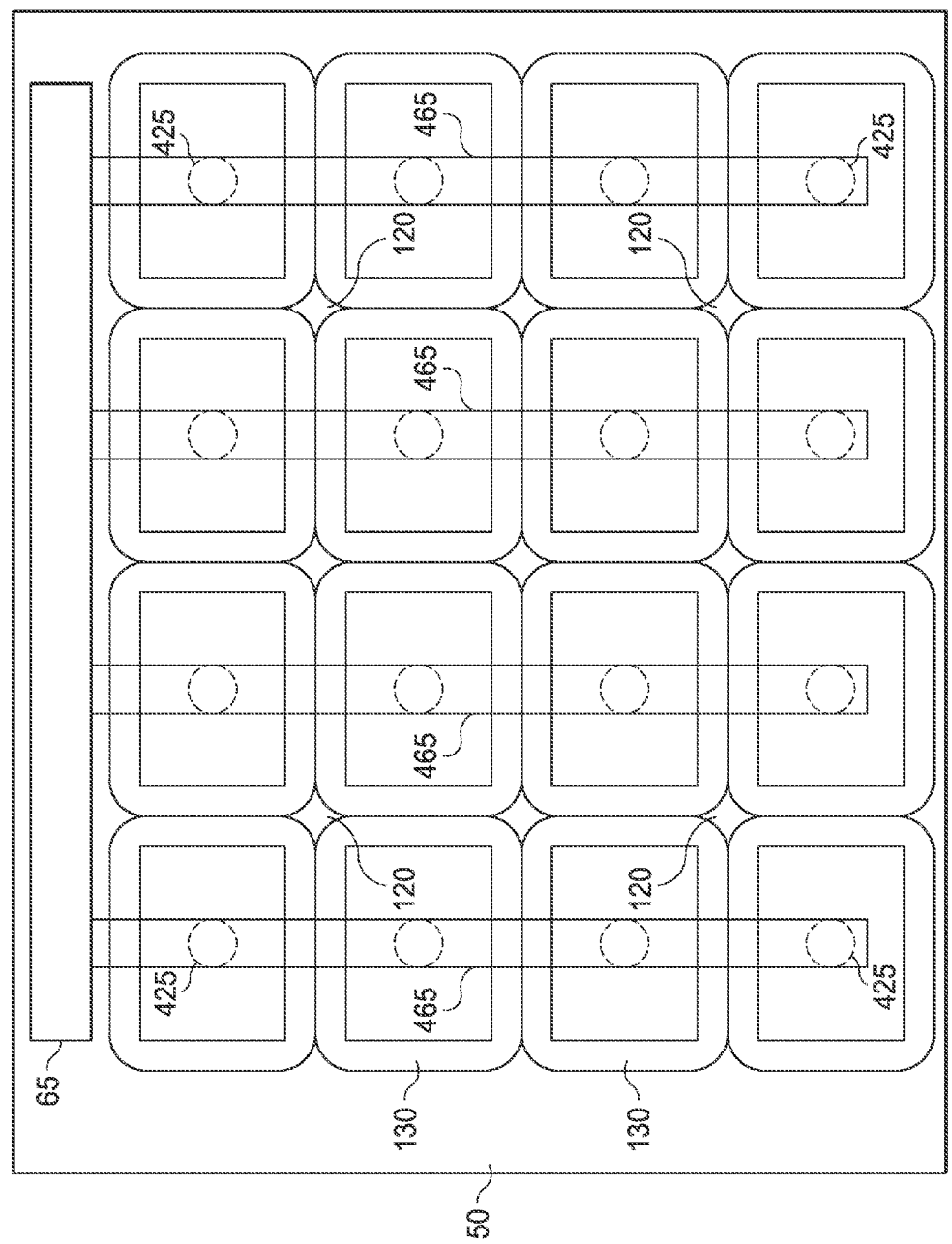

As illustrated in FIG. 12D, contacts may be formed over the substrate 50 as in prior embodiments. The separate field emission devices may be interconnected using metallization. For example, a plurality of metal lines 465 may be coupled to a common first contact pad 65. Thus, an array of field emission devices may be formed. This embodiment may also be fabricated using the embodiments illustrated in FIGS. 6-11 in one or more embodiments.

Figure 13A:
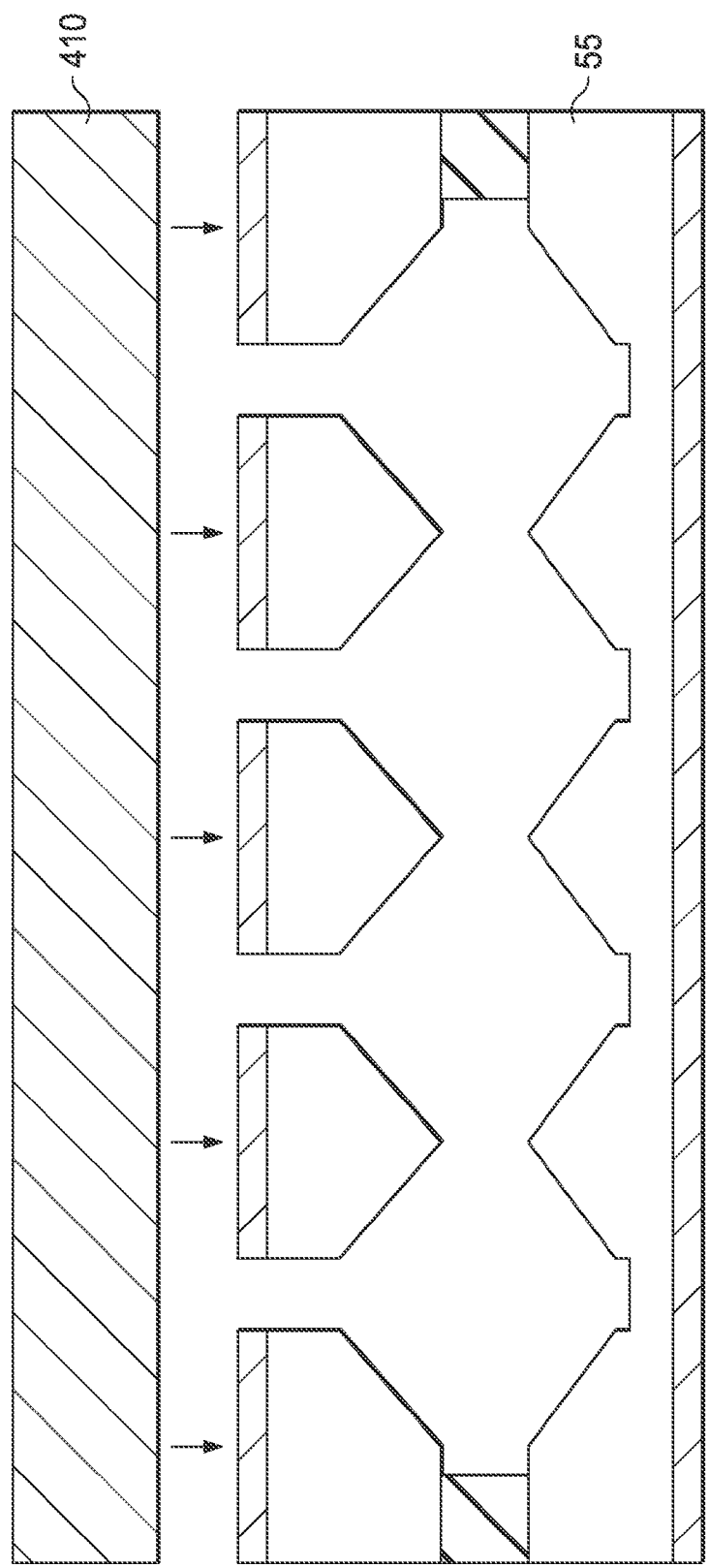
FIGS. 13A and 13B, illustrates a chip scale package comprising field emission devices in accordance with embodiments of the present invention.
Figure 13B:
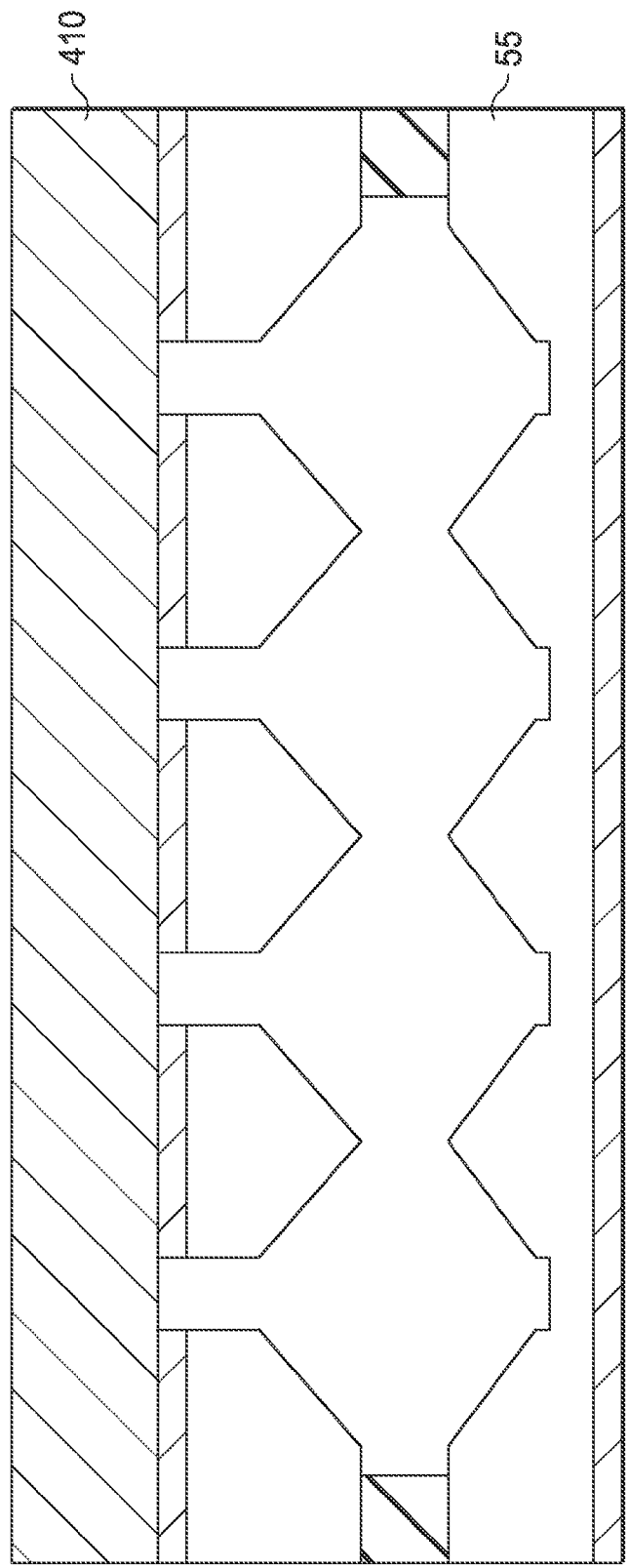

FIG. 13, which includes FIGS. 13A and 13B, illustrates a chip scale package comprising field emission devices in accordance with embodiments of the present invention.

Referring to FIG. 13A, the field emission devices described in various embodiments may be packaged as chip scale packages in one or more embodiments. For example, a conductive lid 410 or a conductive board may be soldered to the contact pads of the die 55 comprising the field emission devices in one or more embodiments. As described previously, the conductive lid 410 may also hermetically seal the gap 30 and the plurality of trenches 120 in the die 55.

Figure 14:
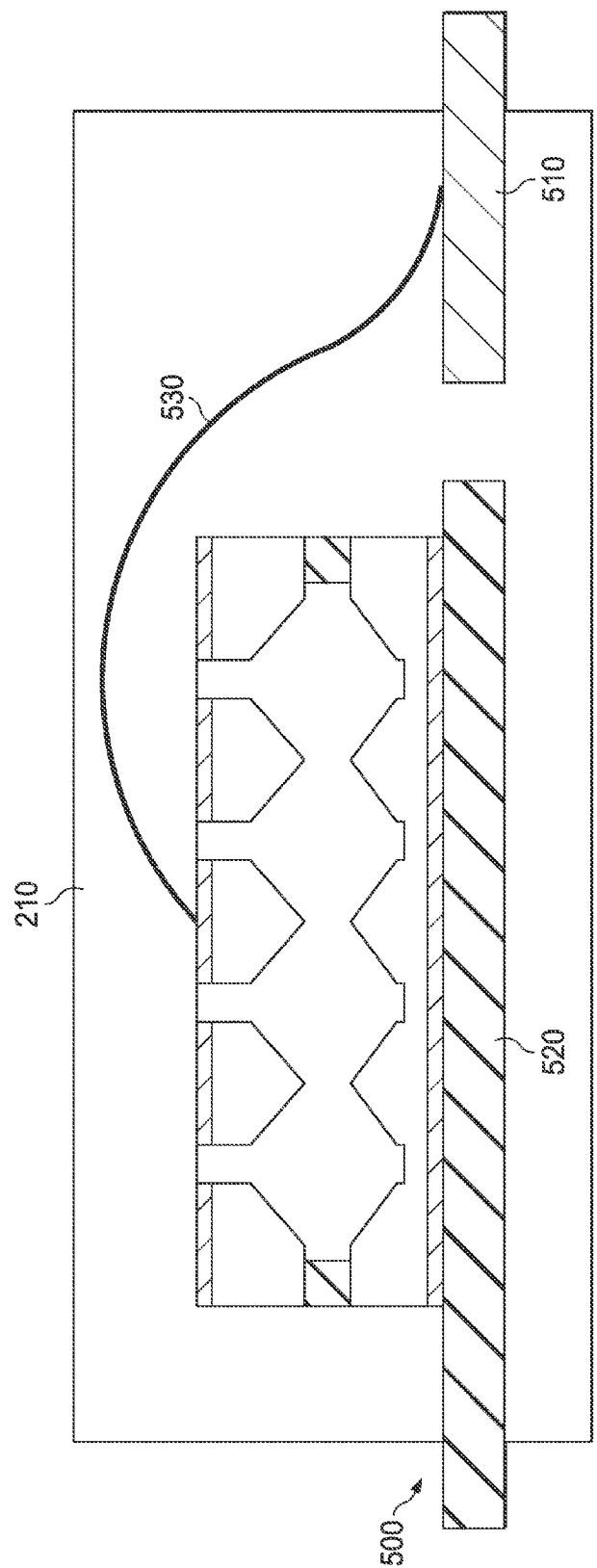
FIG. 14 illustrates a leadframe package comprising a die comprising field emission devices in accordance with embodiments of the present invention.

FIG. 14 illustrates a leadframe package comprising a die comprising field emission devices in accordance with embodiments of the present invention.

A leadframe 500 may include a die paddle 520 and a plurality of leads 510. The die 55 comprising the plurality of field emission devices is electrically coupled to the plurality of leads 510, for example, using bond wires 530 and may also be electrically coupled to the die paddle 520. The die 55 may be encapsulated within a encapsulant 210.

Figure 15:
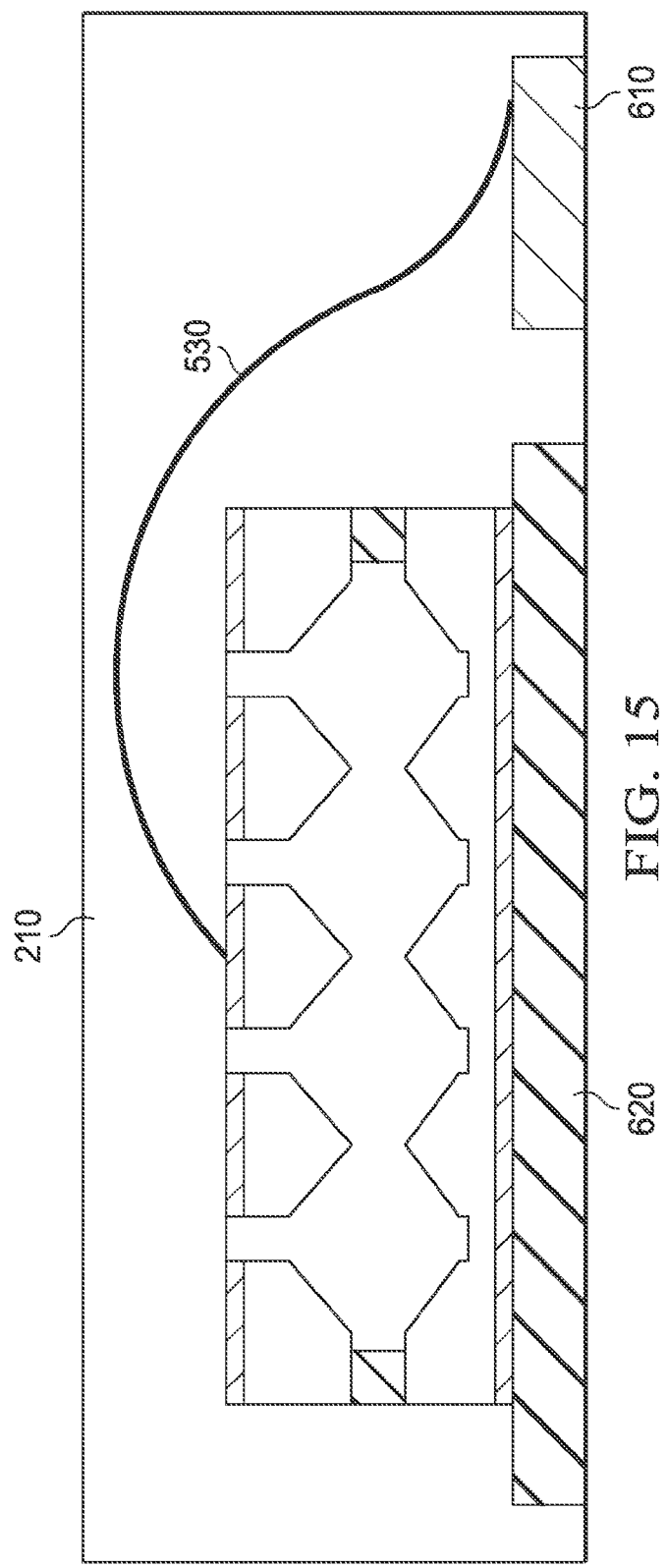
FIG. 15 illustrates a leadless surface mount device package in accordance with an embodiment of the present invention.

FIG. 15 illustrates a leadless surface mount device package in accordance with an embodiment of the present invention.

In one embodiment, the die 55 may be packaged as a thin small leadless package (TSLP) having a surface mount contacts 610 and 620. The die 55 may be encapsulated within an encapsulant 210.

Figure 16A:
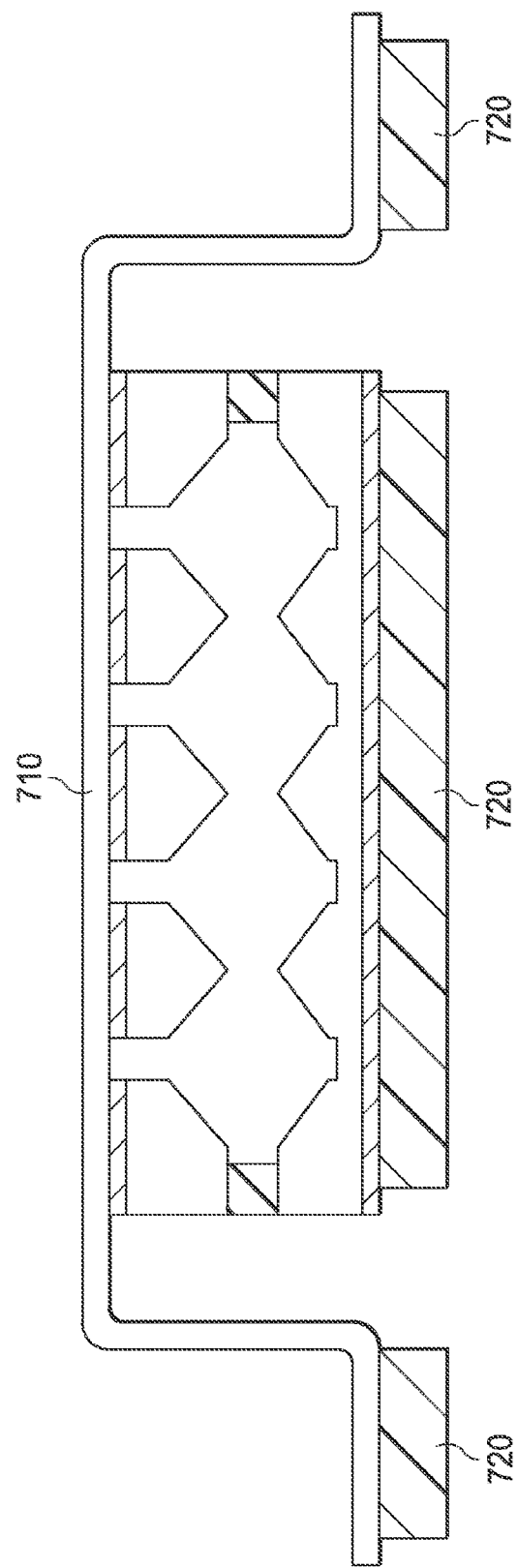
FIGS. 16A and 16B, illustrates a can package in accordance with embodiments of the present invention.
Figure 16B:
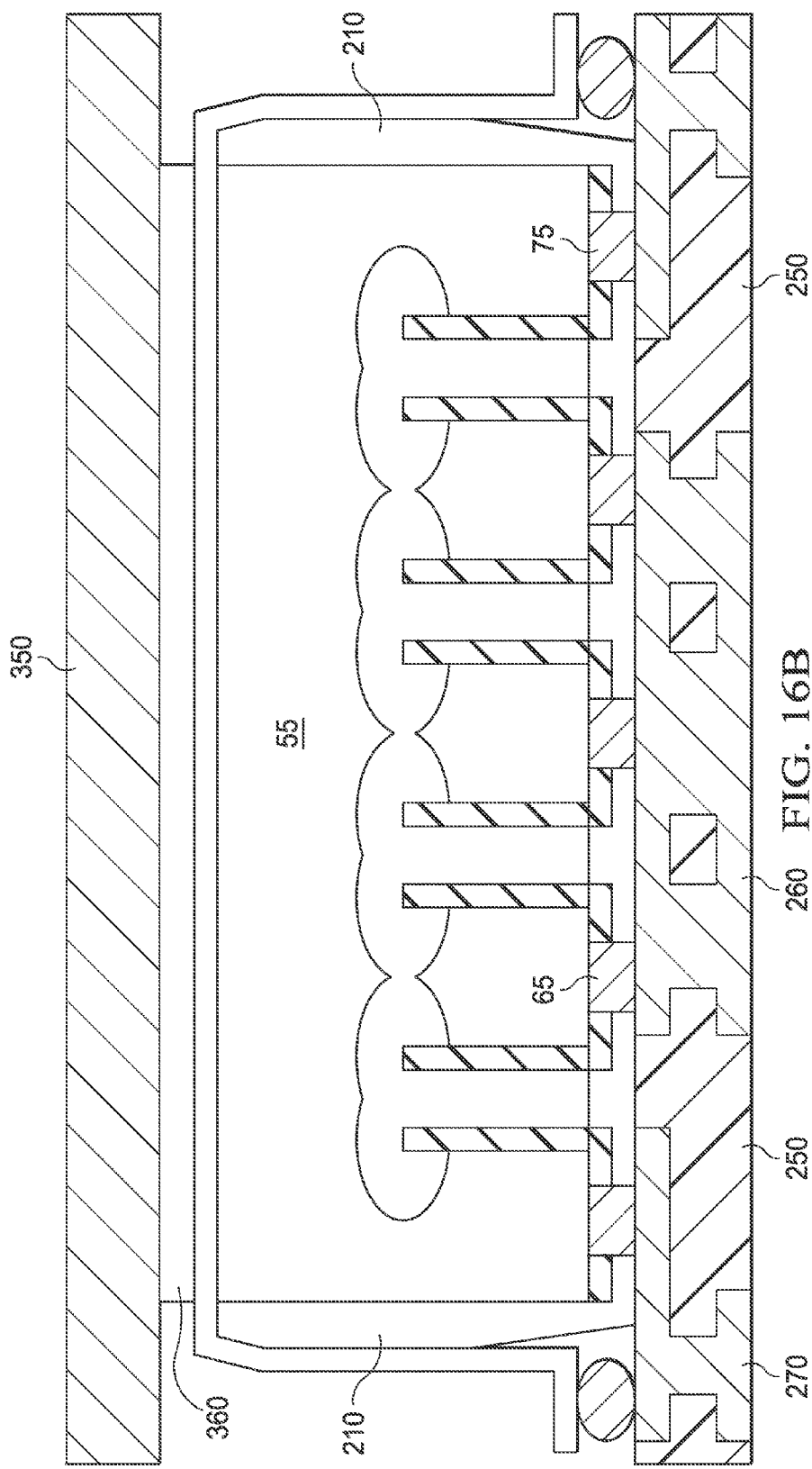

FIG. 16, which includes FIGS. 16A and 16B, illustrates a can package in accordance with embodiments of the present invention.

Referring to FIG. 16A, the can package has a can 710 and printed circuit board 720 for providing contacts. The die 55 comprising the field emission devices may be attached between the can 710 and the printed circuit board 720.

FIG. 16B illustrates an alternative embodiment also showing a heat sink. In various embodiments, the can package provides double sided cooling as a heatsink 350 may be attached to the can 710 through a thermal layer 360 and similarly, another heat sink may be attached to the laminated board 250.

The die 55 is placed over the laminated board 250 in a flip chip configuration such that the first contact pad 65 and the second contact pad 75 face the laminated board 250. The first contact pad 65 and the second contact pad 75 on the die 55 may be attached to corresponding pads on the laminated board 250 using a solder material or a conductive paste in various embodiments. The laminated board may have a first surface contact pad 260 for the first contact pad 65 and a second surface contact pad 270 for the second contact pad 75. An encapsulant 210 may be formed around the die 55 and over the laminated board 250 thereby sealing the gap 30 and the plurality of trenches 120.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-16 may be combined with each other in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising an electrostatic discharge protection device, the electrostatic discharge protection device comprising:
   an array of field emission devices disposed in a semiconductor substrate, the array of field emission device being coupled in parallel with each other and providing a plurality of parallel discharge paths, wherein each field emission device of the array of field emission devices comprises:
      a first emitter/collector region disposed in the semiconductor substrate, the first emitter/collector region having a first edge/tip,
      a second emitter/collector region disposed in the semiconductor substrate, the second emitter/collector region having a second edge/tip, and
      a hermetically sealed gap separating the first edge/tip from the second edge/tip, the first emitter/collector region, the second emitter/collector region, and the gap forming the first field emission device of the array of field emission devices for conducting a portion of the electrostatic discharge (ESD), wherein the first field emission device conducts by an electrostatic emission through the gap, wherein the conduction through the gap completes an electrical connection between the first emitter/collector region and the second emitter/collector region for discharging an ESD pulse;
   a plurality of first contact regions disposed at a first major surface of the semiconductor substrate over the first emitter/collector region of each of the array of field emission devices, wherein each of the plurality of first contact regions is coupled to a corresponding one of the adjacent first emitter/collector region; and
   a common contact region disposed at an opposite second major surface of the substrate, the common contact region coupled to the second emitter/collector region.

2. The device of claim 1, further comprising:
   a third emitter/collector region disposed in the substrate, the third emitter/collector region having a third edge/tip;
   a fourth emitter/collector region disposed in the substrate, the fourth emitter/collector region having a fourth edge/tip; and a second gap separating the third edge/tip from the fourth edge/tip, the third emitter/collector region, the fourth emitter/collector region, and the second gap forming a second field emission device, wherein the first field emission device and the second field emission device form part of the array of field emission devices.

3. The device of claim 1, wherein the first edge/tip and the second edge/tip are pointed tip regions.

4. The device of claim 1, wherein the first edge/tip and the second edge/tip are wedge shaped regions.

5. The device of claim 1, wherein the first edge/tip and the second edge/tip point towards each other.

6. The device of claim 1, wherein the first edge/tip and the second edge/tip have about the same length, and wherein a length of the first edge/tip is about 0.5 µm to about 1 mm.

7. The device of claim 1, wherein the semiconductor substrate comprises silicon.

8. A semiconductor device comprising an electrostatic discharge protection device, the electrostatic discharge protection device comprising:
an array of field emission devices disposed in a semiconductor substrate, the array of field emission device being coupled in parallel with each other and providing a plurality of parallel discharge paths, wherein each field emission device of the array of field emission devices comprises:
a first trench disposed in the semiconductor substrate;
a first cavity disposed in the semiconductor substrate under the first trench;
a first insulating liner disposed on a sidewall of the first trench and extending into the first cavity;
a second trench proximate the first trench;
a second cavity disposed in the substrate under the second trench, wherein the first cavity intersects the second cavity at a first edge/tip and a second edge/tip;
a second insulating liner disposed on a sidewall of the second trench and extending into the second cavity, wherein the first edge/tip is isolated from adjacent first edge/tips other than the second edge/tip by the first and the second insulating liners, and wherein the first edge/tip and the second edge/tip form part of the field emission device;
a plurality of first contact regions disposed at a first major surface of the semiconductor substrate over each of the first edge/tip of each of the array of field emission devices, wherein each of the plurality of first contact regions is coupled to a corresponding one of the adjacent first edge/tips; and
a common contact region disposed at an opposite second major surface of the substrate, the common contact region coupled to the second edge/tip.

9. The device of claim 8, further comprising:
a capping layer sealing the first trench and the second trench.

10. The device of claim 8, wherein the first cavity and the second cavity comprise balloon shaped sidewalls.

11. The device of claim 8, wherein the first edge/tip and the second edge/tip are wedge shaped regions.

12. The device of claim 8, wherein the semiconductor substrate comprises silicon.

13. The device of claim 8, further comprising:
a leadframe comprising a plurality of leads supporting the field emission device;
a bond wire coupling the field emission device with a lead of the leadframe; and
an encapsulant disposed at the leadframe and the field emission device.

14. The device of claim 8, further comprising:
a leadless frame supporting the field emission device;
a bond wire coupling the field emission device with the leadless frame; and
an encapsulant disposed at the leadless frame and the field emission device.

15. The device of claim 8, further comprising:
a can disposed over the field emission device;
a laminated board disposed under the field emission device, wherein the field emission device is disposed between the can and the laminated board; and
an encapsulant disposed at the field emission device.

16. The device of claim 8, further comprising:
a laminated board coupled to contacts of the field emission device; and
an encapsulant disposed at the laminated board and the field emission device, wherein the laminated board and the encapsulant hermetically seal the first cavity and the second cavity.

17. A method of forming an electronic device, the method comprising:
forming an electrostatic discharge protection device by:
forming an array of field emission devices in a semiconductor substrate;
connecting the array of field emission devices in parallel and providing a plurality of parallel discharge paths for electrostatic discharge, wherein forming each field emission device of the array of field emission devices further comprises
forming a first trench and a second trench in the semiconductor substrate;
forming a first edge/tip and a second edge/tip by forming a first cavity under the first trench and a second cavity under the second trench, wherein the first cavity intersects with the second cavity to form the first edge/tip and the second edge/tip, wherein the first edge/tip is opposite the second edge/tip, and wherein the first edge/tip and the second edge/tip form part of a first field emission device; and
forming first isolation liner on sidewalls of the first trench and a second isolation liner on sidewalls of the second trench, wherein the first isolation liner extends into the first cavity past the first edge/tip and the second isolation liner extends into the second cavity past the first edge/tip, wherein the first edge/tip is isolated from adjacent edge/tips other than the second edge/tip by the first isolation liner and the second isolation liner, wherein the first isolation liner and the second isolation liner are formed before forming the first edge/tip and the second edge/tip;
forming a plurality of first contact regions disposed at a first major surface of the semiconductor substrate over the first edge/tip of each of the array of field emission devices, wherein each of the plurality of first contact regions is coupled to a corresponding one of the adjacent first edge/tips; and
forming a common contact region disposed at an opposite second major surface of the substrate, the common contact region coupled to the second edge/tip.

18. The method of claim 17, wherein the first isolation liner and the second isolation liner comprise an oxide.

19. The method of claim 17, wherein forming the first cavity under the first trench and the second cavity under the second trench comprises etching the substrate exposed by the first trench and the second trench with an isotropic etching process.

20. The method of claim 17, wherein the first isolation liner and the second isolation liner comprise nitride.

21. The method of claim 20, wherein forming the first cavity under the first trench and the second cavity under the second trench comprises oxidizing the substrate exposed by the first trench and the second trench.

22. The method of claim 17, wherein forming the first cavity under the first trench and the second cavity under the second trench comprises using an anisotropic crystallographic etching process.

23. The method of claim 17, further comprising:
forming a third trench and a fourth trench in the substrate; and
forming a third edge and a fourth edge by forming a third cavity under the third trench and a fourth cavity under the fourth trench, wherein the third cavity intersects with the fourth cavity to form the third edge and the fourth edge, wherein the third edge is opposite the fourth edge, and wherein the third edge and the fourth edge form a part of a second field emission device.

24. The method of claim 23, wherein the first field emission device has a different gap distance than the second field emission device.

25. The method of claim 24, wherein a first distance between the first trench to the second trench is different from a second distance between the third trench and the fourth trench.

26. The method of claim 24, wherein a first diameter of the first trench and the second trench is different from a second diameter of the third trench and the fourth trench.

* * * * *